United States Patent
Granik et al.

(10) Patent No.: US 7,378,202 B2
(45) Date of Patent: May 27, 2008

(54) GRID-BASED RESIST SIMULATION

(75) Inventors: Yuri Granik, Palo Alto, CA (US); Dmitry Medvedev, Santa Clara, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 11/606,769

(22) Filed: Nov. 29, 2006

(65) Prior Publication Data

US 2007/0196747 A1    Aug. 23, 2007

Related U.S. Application Data

(60) Provisional application No. 60/775,254, filed on Feb. 21, 2006.

(51) Int. Cl.
*G03F 9/00*    (2006.01)
(52) U.S. Cl. .............................. 430/30; 430/5; 716/19; 716/20; 716/21
(58) Field of Classification Search ................... 430/5, 430/30; 716/19, 20, 21
See application file for complete search history.

(56) References Cited

U.S. PATENT DOCUMENTS 7,073,162 B2 *   7/2006   Cobb et al. ................... 716/20

2005/0278686 A1 *   12/2005   Word et al. ................... 716/21

FOREIGN PATENT DOCUMENTS

EP       1 530 083        5/2005
WO       WO01/42964       6/2001

OTHER PUBLICATIONS

Pettigrew et al., "A Laguerre Expansion of the Cauchy Problem For the Diffusion Equation," Database Accession No. 481470, XP002443621, 1994.
Cobb et al., "Fast Sparse Aerial Image Calculation for OPC," *Proceedings of the SPIE*, 2621:534-545, 1995.
Brunner et al., "Simple Models For Resist Processing Effects," *Solid State Technology*, 39(6)95-96, 98, 100, 1996.
Tollukuhn et al., "Will Darwin's Law Help Us to Improve Our Resist Models?" Database Accession No. 7788168, XP002443620, 2003.
Brunner et al., "Impact of resist blur on MEF, OPC and CD Control," *Proceedings of the SPIE*, 5377:141-149, 2004.
Tollukuhn et al., "Do We Need Complex Resist Models For Predictive Simulation of Lithographic Process Performance?," Database Accession No. 8128785, XP002443622, 2004.

* cited by examiner

*Primary Examiner*—Christopher G. Young

(57) ABSTRACT

A grid-based resist simulator predicts how a wafer coated with one or more resist layers will develop when exposed with a mask pattern. Image intensity values are calculated at a grid of points on the wafer, and the image intensity points are analyzed with a resist simulator that produces a resist surface function. A threshold contour of the resist surface function defines how the mask pattern will print on a wafer.

6 Claims, 19 Drawing Sheets

| | CM1 | OPTICS |
|---|---|---|
| HIGHEST (ENGINEERING) LEVEL | TEMPLATE 1<br>TEMPLATE 2 | |
| HIGH (PHYSICAL) LEVEL | PEB<br>DEVELOPMENT | PUPIL<br>SOURCE |
| LOW (MATH) LEVEL | $\sum_{i=0} c_i M_i(I) = T$ | $I(x, y) = \sum_{i=0} c_i \lvert m \otimes K_i \rvert^2$ |

GRID-BASED RESIST SIMULATION

CROSS-REFERENCE TO RELATED APPLICATION

This application claims the benefit of U.S. Provisional Application No. 60/775,254, filed Feb. 21, 2006, which is hereby incorporated by reference.

FIELD OF THE INVENTION

The present invention relates to photolithographic processing in general, and in particular to methods of estimating how features will print on a photolithographic wafer.

BACKGROUND OF THE INVENTION

In conventional photolithographic processing, features are created on an integrated circuit or other device by exposing a mask pattern onto a wafer that is coated with light sensitive resist materials. After exposure, the wafer is chemically and mechanically processed to create the features defined by the exposure pattern.

As the features created on a wafer become increasingly small, optical and other process distortions occur whereby the pattern of features that is desired to be created on a wafer will not match the pattern of features that is actually created on the wafer. To compensate for distortions, many photolithographic processes use one or more resolution enhancement techniques to improve the fidelity with which the desired pattern is printed on the wafer.

In most resolution enhancement techniques such as optical and process correction (OPC), a simulation is made of how a feature will print on a wafer. The simulation is then used to adjust a pattern contained on a mask or reticle in a way that compensates for the expected distortions. As part of the simulation, a model can be used that predicts how the light sensitive resist materials will behave when exposed with a particular mask pattern. Typically, simulations are conducted at sparsely chosen sampling locations or sites to reduce the overall processing time spent on simulation. The local values of image intensity and related other properties, such as derivatives, are calculated at these simulation sites to estimate the behavior of the resist at that point. Suitable site selection procedures are the subject of other inventions in this field, see for example U.S. Pat. No. 7,073,162, and U.S. Patent Publication No. 2005/0278686, both of which are herein incorporated by reference, to ensure the best representation when a sampling approach is taken.

SUMMARY OF THE INVENTION

The present invention is a procedure for producing a more accurate representation of the expected resist behavior that can be computed for all locations in the layout, and is not restricted to discrete sampling sites. This is done by computing a resist surface function that represents how a resist layer on a wafer will appear when exposed and processed using a mask pattern. In one embodiment, image intensity values for a particular mask pattern are calculated for a number of grid points on a wafer by simulating the aerial image of that mask pattern as it would appear in a photolithographic stepper. The image intensity values are then provided to a resist simulator that calculates a resist surface function. A threshold value of the resist surface function is determined and a contour of the resist surface function at the determined threshold value is used to estimate the pattern of features that will be formed during photolithographic wafer processing. From the estimate of how the pattern will print on the wafer, additional resolution enhancement techniques may be employed to increase the fidelity with which a desired pattern can be printed on a wafer.

In accordance with another aspect of the invention, a resist simulator is calibrated using data obtained from a simulated test wafer. Features simulated on the test wafer are measured and analyzed against the test pattern data to determine the value of one or more scaling factors and a threshold value for the resist surface function that predicts the contours of the features printed on the wafer. In one embodiment, the solutions for the scaling factors and threshold value are limited by requiring the resist surface function to have a non-zero derivative at the measurement points where features are printed. In another embodiment, these calibrations are carried out using data gathered from actual test wafers printed using photomasks comprising the designated test patterns.

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

As indicated above, the present invention is a system for simulating how a photosensitive resist layer on a wafer will behave when exposed and processed using a particular mask pattern.

Figure 1A:
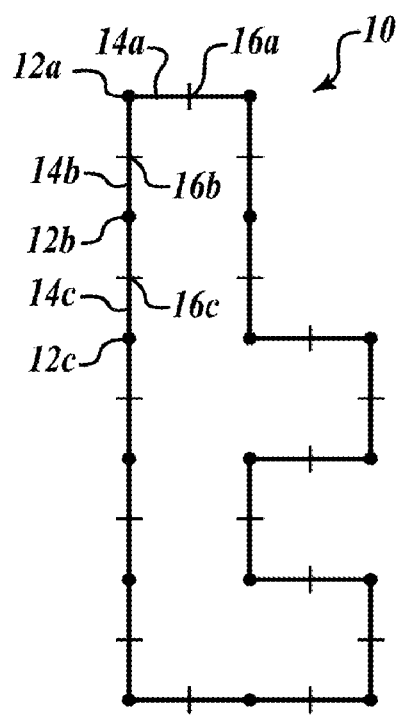
FIGS. 1A and 1B illustrate a conventional method of simulating how a pattern on a mask will be printed on a wafer using a known variable threshold resist simulator.
Figure 1B:
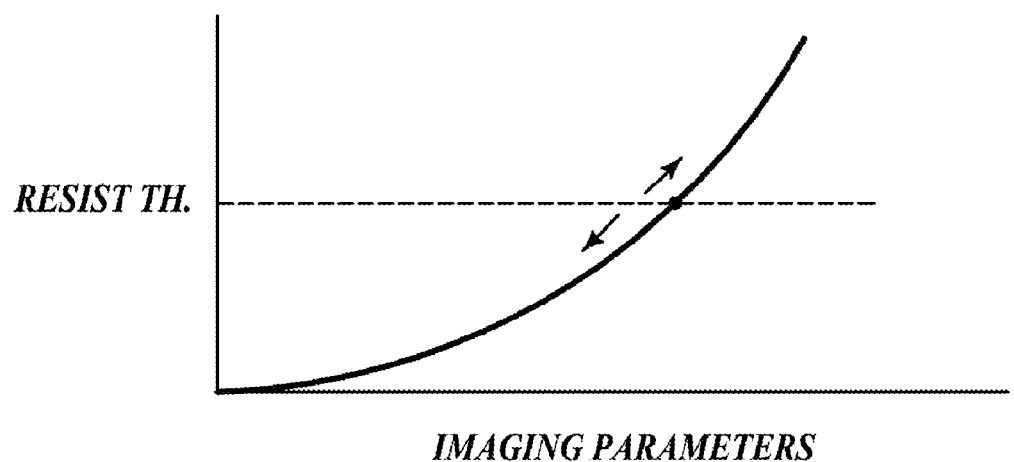

FIGS. 1A and 1B illustrate the process of a conventional method of estimating how a desired feature will print on a photolithographic wafer. In conventional processing, a desired feature 10 to be printed on a wafer is defined as a polygon in a layout description language such as GDS-II or OASIS™. The feature 10 is stored in a layout database that is read by a computer system that executes a program to simulate how the feature will print on a wafer. Typically, the feature 10 is fragmented by the computer system by adding a number of fragmentation endpoints 12a, 12b, 12c, etc., around the perimeter of the polygon. Each pair of fragmentation endpoints define an edge fragment 14a, 14b, 14c, etc., of the polygon. Simulation sites are then selected, with most of the edge fragments associated with a corresponding simulation site 16a, 16b, 16c, etc., comprising a number of points at which estimates of various imaging parameters are calculated. Such parameters may include image intensity, image slope, gradients or contours of image intensity, and other parameters that affect how the feature pattern will be formed on a wafer.

The values of the parameters calculated at the simulation sites 16a, 16b, 16c, etc., are supplied to a resist simulator that estimates how the photosensitive materials at corresponding sites on a wafer will behave when exposed using a mask with the feature pattern in a photolithographic exposure system. There are a variety of photoresists in the market, with properties optimized for various exposure and processing conditions. Most photoresists in use today are positive resists, meaning that exposure to light causes bonds in the resist to break. This scission of bonds reduces local molecular weight and increases solubility. Portions exposed to light therefore wash away when developed, leaving only the unexposed portions on the wafer. There are also negative resists, which cross-link and form less soluble regions when exposed to light, but these are not as common in modern lithographic processes. For the remainder of this document, we will describe these results using a positive photoresist, but this is not meant to be limiting, and could equally apply to a negative resist as well.

Resists can also undergo complex internal chemistry during the exposure process. Chemically amplified resists (CARs) create additional sensitivity by including photo-acid generator (PAG) compounds. Upon exposure, these create compounds that diffuse through the resist, breaking the bonds of the resist catalytically as they come in contact with the various nearby polymer chains. In this regard, the exposure to a single exposing photon, which could only break a single bond in the past, now is amplified, breaking as many bonds as the photo-catalyst can contact. The extent and number of bonds that can be broken by the catalyst varies from resist to resist, and the distance over which the PAG can diffuse to break bonds can be highly dependent on local development conditions, such as temperature, solvent concentration and pH. Exact modeling of the physical processes in detail of such a complex reaction is generally too complicated to accurately include in any large scale image model. Instead, resist models are empirically generated as "lumped parameter" models, grouping the behavior of the resist by generalized parameters. These parameters are typically calibrated to actual resist behavior by measuring the empirical performance of printed test patterns.

In the simplest resist model, it is assumed that the resist will be completely cleared if exposed with an image intensity that is above a fixed, constant threshold. This is called the "Constant Threshold Model". In other embodiments, it has been determined that a resist material will be cleared at a particular threshold that is related to various local image parameters. This is called a "Variable Threshold Resist", or VTR, model. With this variable threshold resist model, it is necessary to compute the local image intensities and various associated values such as derivatives, and calculate the variable resist threshold with which the resist material will be cleared for the immediate image conditions at the simulation site. This is done at each simulation site selected. A variable threshold resist model used by Mentor Graphics of Wilsonville, Oreg., the assignee of the present invention, is referred to below as the VT5 model and employs a searching algorithm to determine the values of imaging parameters at a specific location as well as the value of imaging parameters in neighboring locations.

While the variable threshold resist model has proven accurate in the past, the model is somewhat slow because the variable resist thresholds are calculated for a number of sites before a calculation can be made of how a feature pattern will print. Furthermore, the variable resist threshold is known only at discrete simulation sites associated with particular edges, and is dependent on functions, such as various derivatives of the image intensity, which can change significantly between selected sites. Interpolating accurately what the value should be between irregularly spaced sites may not be possible, and additional simulation sites must be added to make up for the missing information. The present invention seeks to improve upon the speed at which the resist simulator can predict how a particular mask pattern will print on a wafer.

Figure 2:
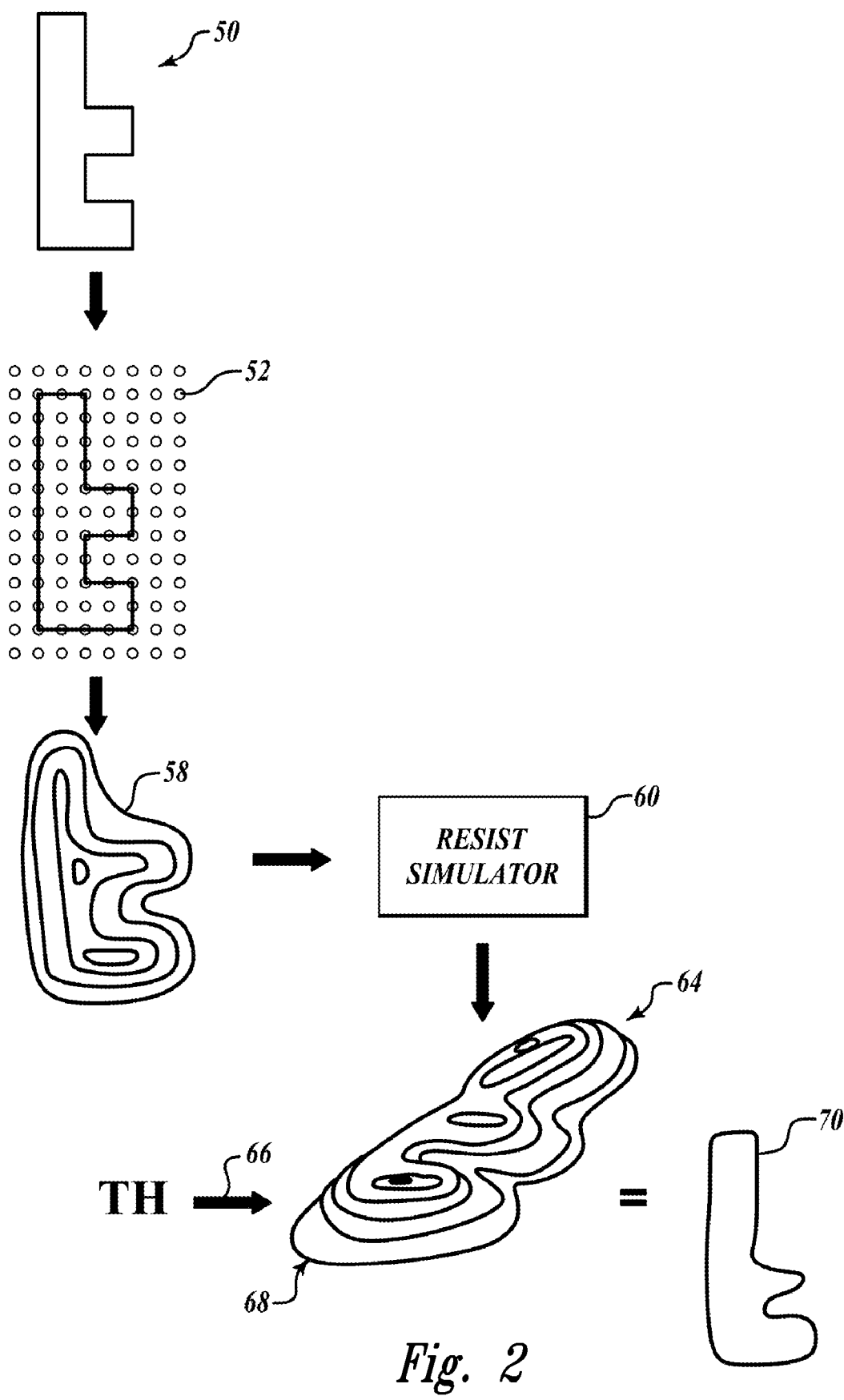
FIG. 2 illustrates a method of simulating how a pattern on a mask will be printed on a wafer using a grid-based resist simulator in accordance with one embodiment of the present invention.

FIG. 2 illustrates one embodiment of a resist simulator for estimating how a feature will print on a wafer in accordance with the present invention. In this embodiment, a target feature 50 is supplied to a grid-based aerial image model that calculates the expected image intensity I(x,y) at a regular series of fixed grid points 52 on the wafer. In one embodiment, the spacing of the grid points 52 is equal to the Nyquist value so that the image intensity can be calculated anywhere within the grid, not just on the grid points. One suitable aerial image model is described in U.S. patent application No. 11/236,208, which is herein incorporated by reference.

With the image intensity estimated at each of the grid points 52, contours 58 of constant image intensity values can be computed. The image intensity values computed at each of the grid points is supplied to a resist simulator 60 that computes a resist surface function R(x,y) 64. The resist surface function 64 represents a transformation of the aerial image intensity function, in accordance with empirical calibrations describing how a resist material on a wafer will behave when exposed with light intensity values that are estimated by the aerial image model 52. From the resist surface function 64 that is calculated by the resist simulator 60, a single threshold value can be determined from the contours indicated by contour lines 66, 68. This contour represents the boundary of the resist that will be formed during photolithographic exposure and development.

This threshold value is selected via a calibration procedure, and a corresponding constant resist contour line such as contour 66 at the determined threshold is selected. The selected contour corresponds to how the mask pattern will print on the wafer. Once the simulated printing on the Wafer has been determined from the selected contour of the resist surface function 64 produced by the resist simulator 60, additional computations can be made to apply OPC or other resolution enhancement techniques to increase the fidelity with which the target feature 50 can be printed on the wafer. As described in further detail below, the resist simulator 60 of the present invention computes how the resist will develop at each location from the image intensity values calculated on the grid points by the aerial image model.

Although mathematically equivalent to VTR results at the simulation sites used for the variable threshold resist model, the resist surface function 64 has the advantage of having a defined value everywhere, not just at particular simulation sites, making interpolation at other sites of interest straightforward. It is therefore especially suited for use in simulations for dense OPC and other grid-based simulation applications. Moreover, the computations required to take a constant threshold contour of the resist surface function are easier and faster than the more complex computations required to locally calculate the various imaging parameters and to compute a different local threshold from the aerial image for each simulation site. In this way, the techniques of the present invention can be both computationally faster and more accurate.

Figure 2A:
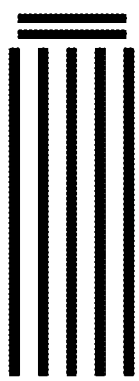
FIGS. 2A-2C illustrates a mask layout and its corresponding aerial image and the resist surface function generated in accordance with one embodiment of the present invention.
Figure 2B:
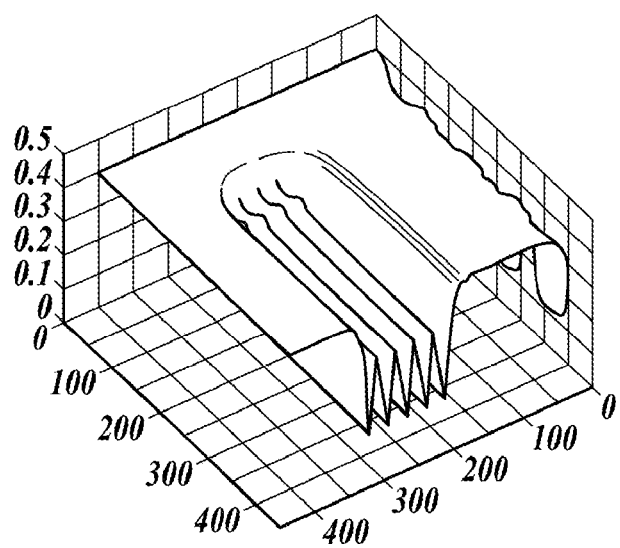
Figure 2C:
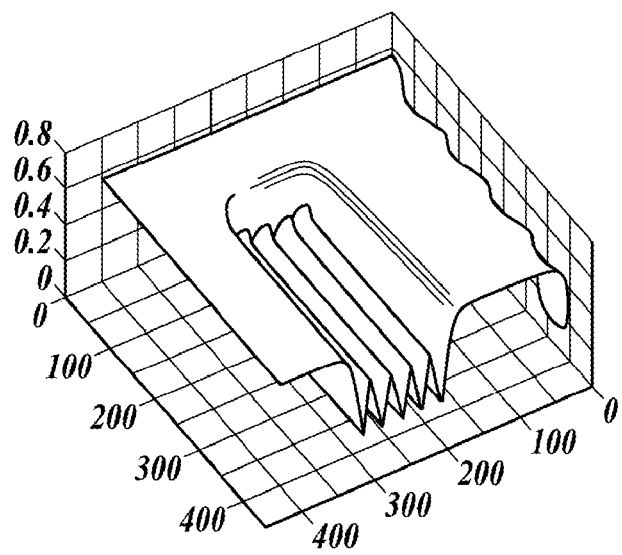

FIGS. 2A-2C illustrates a specific example of a layout, as shown in FIG. 2A, in which a set of five dark vertical lines is the desired image. For this example, two horizontal SRAFs have been added to improve pattern fidelity. FIG. 2B shows a simulation the aerial image I(x,y) normally produced for such a mask layout, using a wavelength $\lambda$=193 nm, a scanner lens numerical aperture NA =0.85, and Quasar illumination with an inner $\sigma$ of 0.55 and an outer $\sigma$=0.97. FIG. 2C shows the Resist Surface Function R(x,y) derived from I(x,y). Although R(x,y) and I(x,y) clearly bear some resemblance, they are different in certain details, particularly near the line-ends.

The following describes one embodiment of the resist simulator 60 in greater mathematical detail, including techniques to speed computations on a networked or stand alone computer system.

Formal Description

Figure 3:
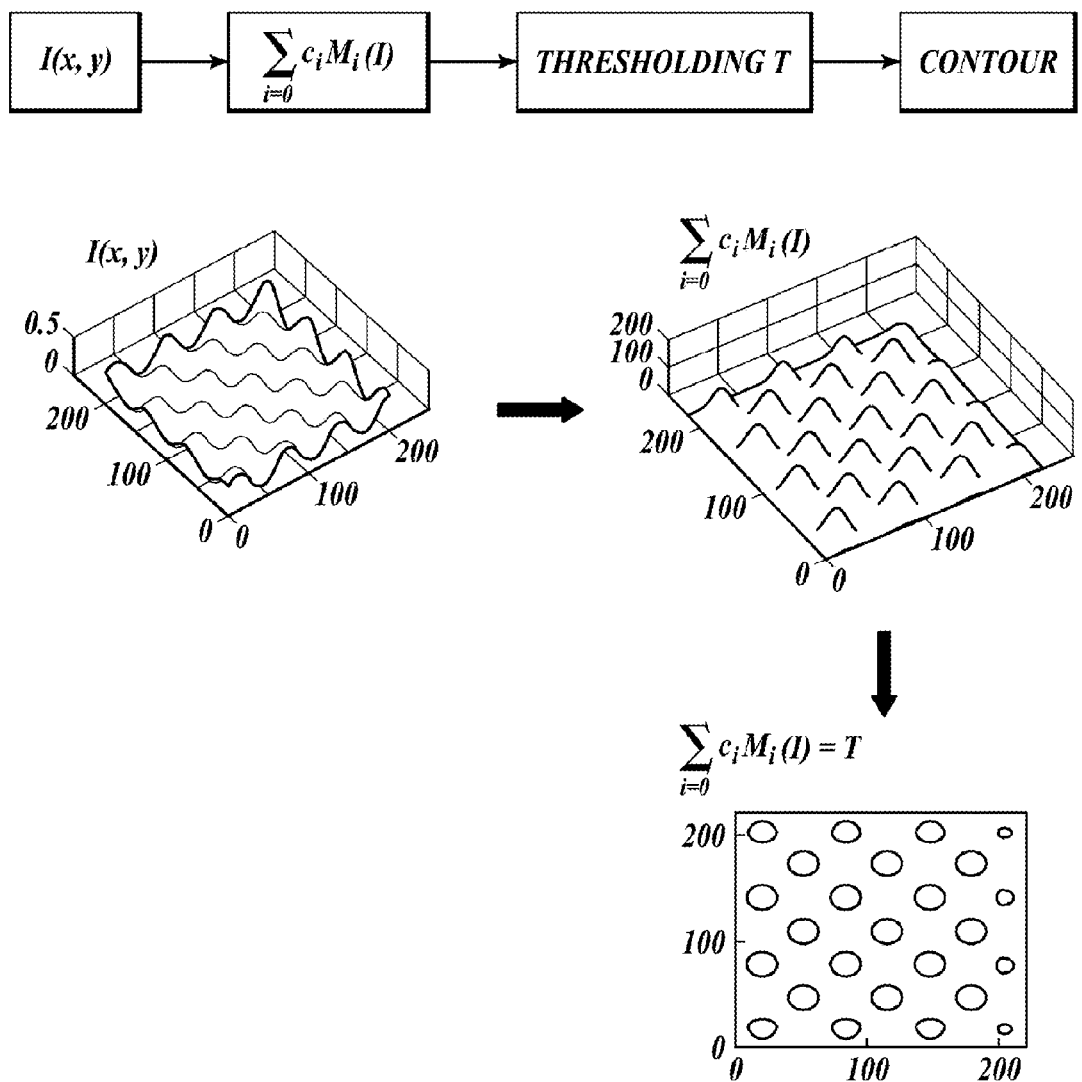
FIG. 3 illustrates a resist simulating process in accordance with one embodiment of the present invention.

The output of the resist simulator in accordance with one embodiment of the present invention is a resist contour such as that shown in FIG. 3, which results from the thresholding of the resist surface function R(x,y):

$$R(x,y)=T, \quad (1a)$$

where T is the thresholding constant. The particular resist threshold that defines the boundaries of a feature printed on a wafer is selected during a calibration procedure as described below. The resist surface function R(x,y) depends on the aerial image I(x,y), hence the model input is image intensity I(x,y). R is a linear combination of the modeling terms $M_i$ scaled by a calibration constant:

$$R(x, y) = \sum_i c_i M_i(I) \quad (1b)$$

Each modeling term M is a sequence of mathematical operations including neutralization, derivative, power n, convolution, and root n applied to the image intensity I:

$$M = ((\nabla^k I_{\pm b})^n \otimes G_{s,p})^{\frac{1}{n}} \quad (2)$$

where b, k, n, s and p are generally different for different modeling terms, and $G_{s,p}$ are a set of basis functions such as Gaussian functions or Gauss-Laguerre polynomials..

In one embodiment, the discrete parameters for each modeling term are
  plus or minus for neutralization b
  derivative order k=0, 1, or 2
  power n=1, 2, or 3
  G-L index p=0, 1, 2, . . . , 7
For p=0 this yields 18 combinations that describe various physical quantities (as explained in further detail below).
There are 2 continuous non-negative parameters
  neutralization level b
    +b=0 leaves image intensity unaltered, i.e., neutralization is ignored
  diffusion length s
    s=0 means diffusion is ignored.

The input into the resist simulator is I=I(x,y). It is a smooth, band-limited function, devoid of high frequencies. The neutralization operator leaves this function continuous, but introduces discontinuous first derivatives, i.e., the resulting function is not smooth. This also introduces a tail of high frequencies into the function spectrum, complicating convolution operation. This tail falls off generally as $1/f^2$, where f is the spectral coordinate. If the first derivative is taken after neutralization, the result will be a discontinuous function with spectrum tail 1/f. Taking second derivative after neutralization is even worse. This generates infinite values hence should be avoided. Therefore, one embodiment of the invention uses the following restrictions:
  taking second derivates after neutralization is prohibited
    combination k=2, b>0 is prohibited
  taking first derivative after neutralization is discouraged
    combination k=1, b>0 is discouraged
  Convolution with Gauss-Laguerre polynomial bases for p>0 can produce negative values, because only the first base p=0 is positively defined. Taking square root is not possible, if the negative values are produced, thus
    taking square root n=2 is prohibited after convolutions with kernels p>0.
  Taking n=3 root for p>0 is also prohibited.

Scaling With the Dose

For a single exposure, the dose d from a setup file scales the aerial image I of the unity dose, so that $$I(d)=dI \quad (2a)$$

This multiplier d can be propagated into the resist simulator. For each modeling term the following scaling is true:

$$M(I(d)) = M(dI) = d\left(\left(\nabla^k I_{\pm\frac{b}{d}}\right)^n \otimes G_{s,p}\right)^{\frac{1}{n}}, \quad (3)$$

thus the scaled resist simulator is $$\sum_i c_i \left(\left(\nabla^k I_{\pm\frac{b}{d}}\right)^n \otimes G_{s,p}\right)^{\frac{1}{n}} = \frac{T}{d}. \quad (4)$$

This scaled simulator differs from the original simulator only by the different, scaled threshold and different, scaled coefficients b. So the conclusion is that if it is desired to change the dose of the single exposure, the aerial image intensity can be left unchanged, but the threshold and neutralization levels b can be scaled as follows:

$$T \to \frac{T}{d} \quad (4a)$$

$$b \to \frac{b}{d}.$$

When the resist simulator of the present invention has no neutralization rates, the scaling is especially simple, i.e., by changing the threshold.

The following description defines the operator terms used in one embodiment of a resist simulator in accordance with the present invention.

Neutralization Operator

The "neutralization" operator is defined as a lowercase index +b or −b. The real constant b is always non-negative. The "+b" operator for a function f(x,y) is defined as $$f_{+b}(x, y) = \begin{cases} f(x, y) - b, & f \geq b \\ 0, & f < b \end{cases} \quad (5)$$

and "−b" operator is $$f_{-b}(x, y) = \begin{cases} b - f(x, y), & f \leq b \\ 0, & f > b \end{cases} \quad (5a)$$

In both cases the output is non-negative. A more uniform expression is through the module:

$$f_{\pm b} = \frac{|f - b| \pm (f - b)}{2}. \quad (6)$$

Figure 4:
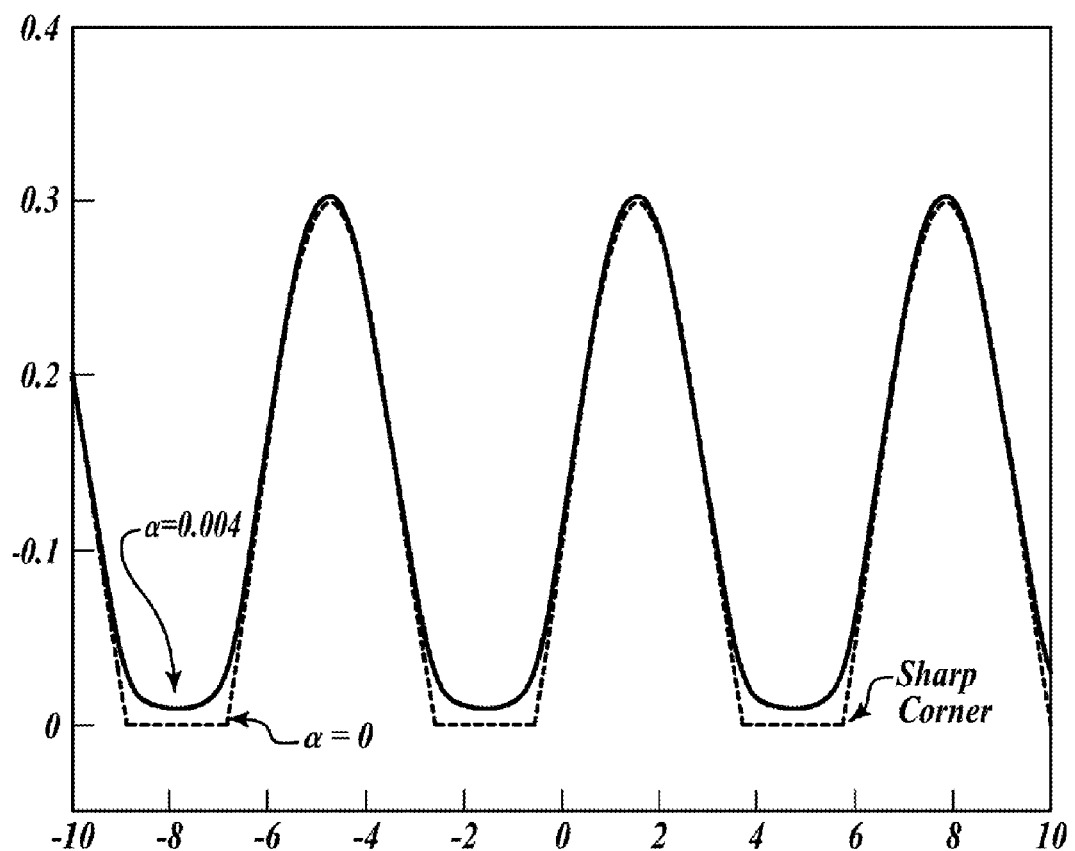
FIG. 4 illustrates smoothed and sharp neutralizations.

Thus defined neutralization yields generally non-smooth functions, with sharp "corners" at f=0, shown in FIG. 4 that shows a smoothed neutralization versus a sharp neutralization. The previous expression can be relaxed by substitution $$|f| \approx \sqrt{a^2 + f^2}, \quad (7)$$

where α is a small (compared to f) regularization constant.

This results in a smoothed operator $$f_{\pm b} = \frac{\sqrt{a^2 + (f - b)^2} \pm (f - b)}{2} \quad (8)$$

$$a \ll b.$$

Derivatives

An important explanation parameter for resist development on a wafer is image slope, so one embodiment of the resist simulator of the present invention includes image intensity derivatives. The slope of a 2D function f(x,y) depends on the direction of derivation. At each point (x,y) there is a direction at which the derivative reaches maximum. The slope S of this direction is the length of the gradient vector:

$$S(x, y) = \sqrt{\left(\frac{\partial}{\partial x} f\right)^2 + \left(\frac{\partial}{\partial y} f\right)^2} = |\nabla f| \quad (9)$$

Second derivatives of the function can be introduced by scalar multiplication of the gradient operator:

$$C(x, y) = \frac{\partial^2}{\partial x^2} f + \frac{\partial^2}{\partial y^2} f = \nabla \cdot \nabla f = \nabla^2 f \quad (10)$$

The derivatives can be combined into one expression by using integer power k=0,1, and 2 of the gradient operator:

$$\nabla^k f = \begin{cases} f(x, y), & k = 0 \\ S(x, y), & k = 1 \\ C(x, y), & k = 2 \end{cases} \quad (11)$$

For the sake of simplicity, the vector module operator |.| for the slope S is omitted in the notation below.

Normalized Derivatives

Assuming that the coordinates x and y are measured in micrometers (um), the derivatives has the following dimensionalities $$[S(x, y)] = um^{-1} \quad (11a)$$

$$[C(x, y)] = um^{-2}.$$

In one embodiment of a variable threshold resist model, image intensity curvature is scaled by the normalization constant 0.04 um². This normalization helped to pull curvature values closer to 1. In the resist simulator of the embodiment described, the normalization constant is 0.01 um² (4× smaller, because max curvature values are usually around 3 when using 0.04) to normalize second derivatives $$\overline{C}(x, y) = 0.01 \cdot C(x, y) = 0.01 \cdot \left(\frac{\partial^2}{\partial x^2} f + \frac{\partial^2}{\partial y^2} f\right) = \frac{\partial^2}{\partial \overline{x}^2} f + \frac{\partial^2}{\partial \overline{y}^2} f \quad (12)$$

$$\overline{x} = 10x, \overline{y} = 10y$$

Curvature $\overline{C}(x,y)$ becomes dimensionless in dimensionless coordinates $\overline{x}$, $\overline{y}$. The definition of the corresponding dimensionless slope is $$\overline{S}(x,y) = \sqrt{\left(\frac{\partial}{\partial \overline{x}}f\right)^2 + \left(\frac{\partial}{\partial \overline{y}}f\right)^2} = 0.1 \cdot S(x,y) \quad (13)$$

The dimensionless gradient operator is defined as $$\overline{\nabla}^k f = \begin{cases} f(x,y), k=0 \\ \overline{S}(x,y), k=1 \\ \overline{C}(x,y), k=2 \end{cases} \quad (14)$$

For the sake of simplicity, the overbar "¯" is dropped from the notation, so that all derivatives are calculated in dimensionless sense.

Convolution

Convolution operation between function f and a kernel K is denoted by the $\otimes$ symbol:

$$f(x,y) \otimes K(x,y) \quad (15)$$

In the embodiment described, the kernels are Gaussian kernels $$G_s(x,y) = \frac{1}{\pi s^2} \exp\left(-\frac{x^2+y^2}{s^2}\right) \quad (16)$$

or in polar coordinates $$G_s(r) = \frac{1}{\pi s^2} \exp\left(-\frac{r^2}{s^2}\right) \quad (17)$$

$$r^2 = x^2 + y^2$$

where s is the diffusion length. The normalization constant $$\frac{1}{\pi s^2}$$

is typically chosen so that the space integral of the kernel is 1:

$$\iint rG_s(r) dr d\varphi = \frac{1}{2\pi} \int_0^{2\pi} d\varphi \int_0^\infty \exp\left(-\frac{r^2}{s^2}\right) d\left(\frac{r^2}{s^2}\right) = 1. \quad (18)$$

This kernel converges to the delta function when $s \to 0$:

$$(19) \quad \lim_{s \to 0} G_s(r) = \delta(r).$$

G-L Orthogonal Kernels

To increase explanation power of the model (i.e., its ability to predict data measured from a test wafer), the Gaussian kernel is generalized by multiplying it by Laguerre polynomials:

$$G_{s,p}(r) = \frac{1}{\pi s^2} \exp\left(-\frac{r^2}{s^2}\right) L_p\left(2\frac{r^2}{s^2}\right), \quad (20)$$

where $L_p$ represents Laguerre polynomials; polynomial order p=0,1,2, . . . For any fixed positive s functions are orthogonal in the polar coordinate system r, $\phi$ for $0 \leq r < \infty$. They constitute Gauss-Laguerre (G-L) functional base.

To prove orthogonality, the following orthogonal condition for Laguerre polynomials is used:

$$\int_{z=0}^\infty e^{-z} L_p(z) L_q(z) dz = \begin{cases} 1, & p=q \\ 0, & p \neq q \end{cases}. \quad (21)$$

The product of two G-L functions $G_{s,p}$ and $G_{s,q}$ are integrated as follows:

$$\int_{\varphi=0}^{2\pi} d\varphi \int_{r=0}^\infty r G_{s,p}(r) G_{s,q}(r) dr = \quad (22)$$

$$2\pi \left(\frac{1}{\pi s^2}\right)^2 \int_{r=0}^\infty r \exp\left(-\frac{2r^2}{s^2}\right) L_p\left(\frac{2r^2}{s^2}\right) dr \bigg|_{z=\frac{2r^2}{s^2}} =$$

$$\frac{\pi}{2} \frac{1}{\pi^2 s^2} \int_{z=0}^\infty e^{-z} L_p(z) L_q(z) dz = \begin{cases} \frac{1}{2\pi s^2}, & p=q \\ 0, & p \neq q \end{cases},$$

which means that $G_{s,p}$ and $G_{s,q}$ are orthogonal.

Integrals of the kernels alone are +1 or −1:

$$\int_{\varphi=0}^{2\pi} d\varphi \int_{r=0}^\infty r G_{s,p}(r) dr = (-1)^p, \quad (23)$$

Therefore, the constant function being convolved with $G_{s,p}$ yields +constant or −constant, i.e., absolute value of the constant function is not affected by the convolution with a G-L function. G-L bases for small diffusion lengths approximate the delta function $$\lim_{s \to 0} G_{s,p}(r) = (-1)^p \delta(r), \quad (24)$$

so that the convolution with G-L bases of small s can only flip the resulting sign:

$$f(x,y) \otimes G_{0,p}(x,y) = (-1)^p f(x,y) \quad (25)$$

The first 4 Laguerre polynomials are:

$$L_0(z) = 1 \quad (26)$$

$$L_1(z) = -z + 1$$

$$L_2(z) = \frac{1}{2}(z^2 - 4z + 2)$$

-continued $$L_3(z) = \frac{1}{6}(-z^3 + 9z^2 - 18z + 6).$$

Figure 5:
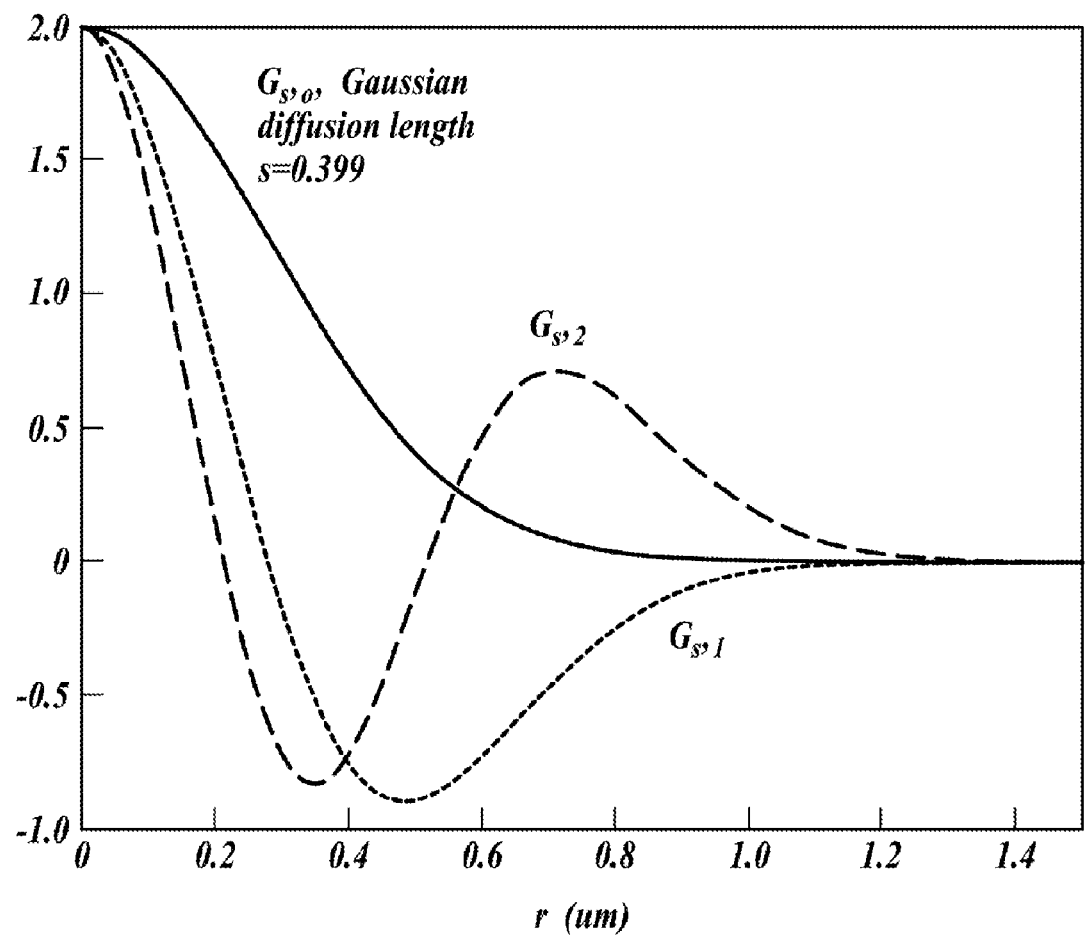
FIG. 5 illustrates three Gaussian-Laguerre polynomials.
Figure 6:
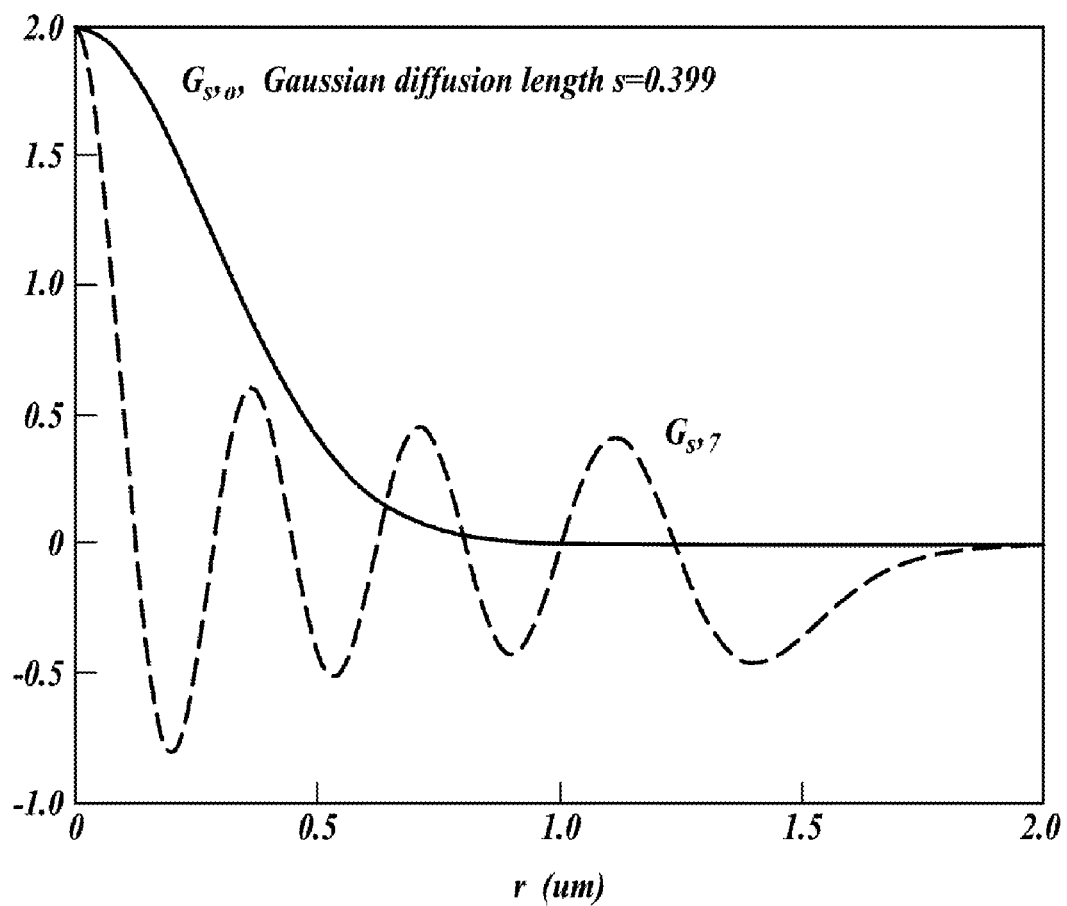
FIG. 6 illustrates a seventh Gaussian-Laguerre polynomial.

Thus the first kernel $$G_{s,0} = G_s \qquad (27)$$

is a Gaussian kernel. Plots of the kernel shapes, for the first three G-L bases are depicted in the FIG. 5. The kernel index defines how many roots the kernel has or how many minima and maxima it has. For instance, $G_{s,0}$ has no roots/does not intersect the x-axis and $G_{s,2}$ has two roots. FIG. 6 compares first and seventh bases for $$s = \frac{1}{\sqrt{2\pi}} \approx 0.399 \, um.$$

$G_{s,7}$ effectively extends up to 5*s=2.0 um.

In the embodiment of the invention described, only the first 8 bases $G_{s,0}, G_{s,1}, \ldots, G_{s,7}$ are used. These have an effective support region which is 5 times larger than the diffusion length s. This "5×" rule can be used to determine interaction distance of the 8 kernels.

Figure 7:
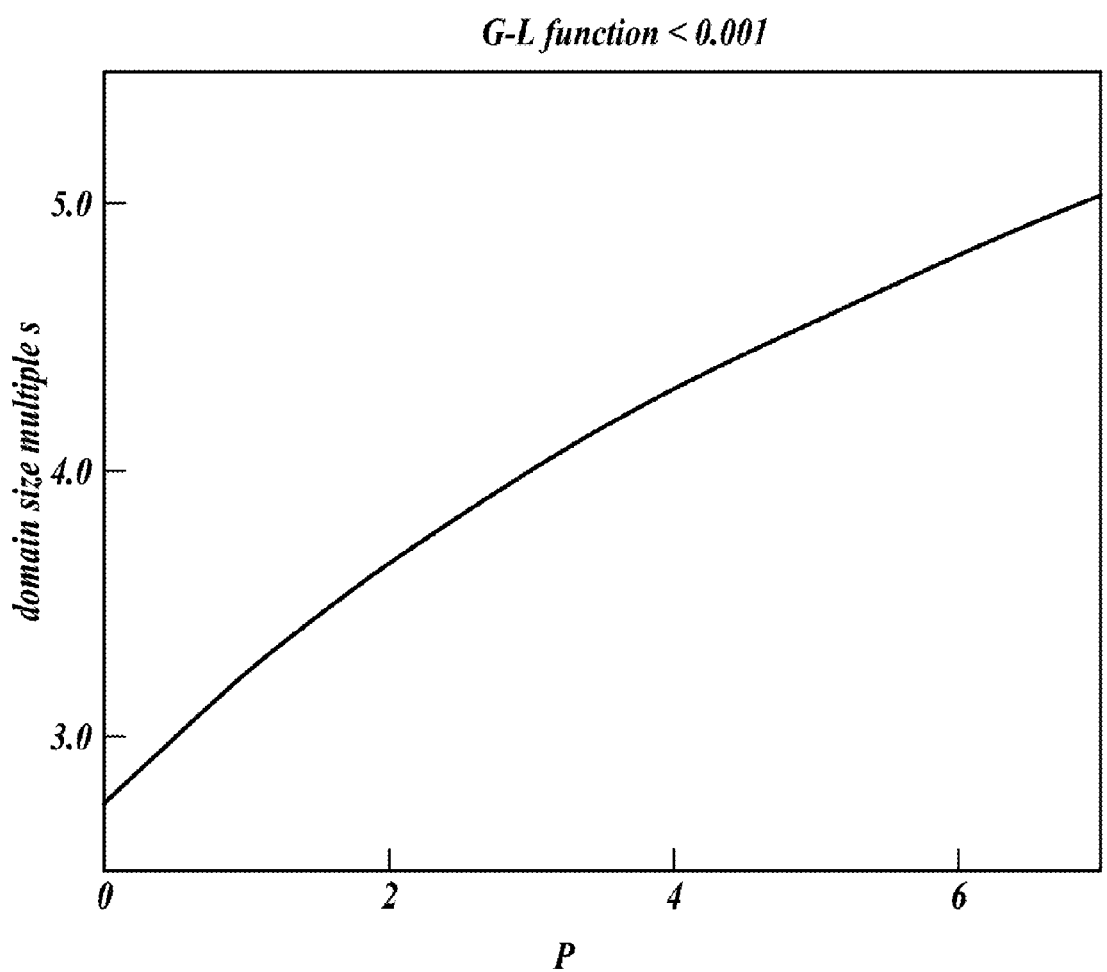
FIG. 7 illustrates the interaction radius on the Gaussian-Laguerre polynomial.

Interaction distance depends on the largest index p used in the model. An interaction distance (or domain size) is defined as the radius for which $|G_{s,p}|<0.001$. FIG. 7 shows dependence of such defined interaction radius on the G-L order p. This dependence is summarized in the table below.

TABLE 1

Interaction distance as a function of the diffusion length s.

| | p | | | | | | | |
|---|---|---|---|---|---|---|---|---|
| | 0 | 1 | 2 | 3 | 4 | 5 | 6 | 7 |
| interaction | 2.75s | 3.25s | 3.7s | 4s | 4.3s | 4.6s | 4.8s | 5s |

Prior to use in predicting how a mask pattern will print on a wafer, the resist simulator is calibrated to determine the values of the scaling coefficients $c_i$ and the resist threshold value T.

Discrete parameters are fixed during calibration. Parameter s and optionally b are typically tuned using non-linear optimization, while the coefficients $c_i$ and T are optimized using least square fitting, subject to the regularization constraints.

$$\sqrt{\sum_{i=0, i \neq q} c_i^2} \leq c_{max} \qquad (28)$$

$$c_q = 1,$$

To keep all but one coefficient small, $c_{max}$ is a user defined regularization parameter. Practically speaking it should be some small portion of the threshold T, but may be as large as 0.5T. One of the modeling terms $c_q$ should always be 1. This anchoring term is excluded from the aforementioned inequality constraint. In one embodiment, a user specifies the anchoring term, i.e., specifies the index q. Good practical choices for the anchoring modeling terms are I(+b=0, n=1, k=0, s=0, p=0) or diffused I (+b=0, n=1, k=0, s>0, p=0), or neutralized and diffused I (+b>0, n=1, k=0, s>0,p=0).

In another embodiment of the invention, parameters b and s may be tuned using non-linear optimization. The linear coefficients $c_j$ and T are optimized using the following procedure.

In some embodiments of the invention, these calibrations can be made using detailed simulations of particular test pattern features as they would print using a photolithographic process, placing gauges for measurement of the simulated behavior at certain points of interest.

The objective function is $$F(c_j, T) = \sum_i w_i * \left[\left(\sum_j c_j M_j(x_i)\right) - T\right]^2 \qquad (29)$$

where $x_i$ are the edge positions along gauges placed on features formed on a simulated test wafer and measured, $w_i$ are gauge weights, and $M_j(x_i)$ are values of resist simulator terms at the edge positions. One the coefficients $c_q$ is fixed at the value of unity, $c_q=1$. The model term q is called the anchoring term. A user specifies the anchoring term, i.e., specifies index q. Good practical choices for the anchoring modeling terms are I (+b=0, n=1, k=0, s=0, p=0) or diffused I (+b=0, n=1, k=0, s>0, p=0, or neutralized and diffused I (+b>0, n=1, k=0, s>0,p=0). The threshold T is fixed at the average anchor the term value:

$$T = \overline{M}_q \qquad (30)$$

where the average anchoring term is $$\overline{M}_q = \sum_i w_i M_q(x_i) \qquad (30a)$$

(assuming that the weights have been renormalized to that their sum is equal to 1). The value $T=\overline{M}_q$ is what would be obtained from minimization of the objective function F above if the anchoring term were the only term in the model. The objective function F above is minimized with respect to the coefficients $c_j$, $j \neq q$, keeping $c_q$ and T fixed. The constraint $$\sqrt{\sum_{j, j \neq q} c_j^2} \leq c_{max} \qquad (31)$$

is imposed during minimization. The user specifies $c_{max}$. Generally values of $c_{max}$ of about 0.5 lead to good results.

Figures 8A, 8B, 9:
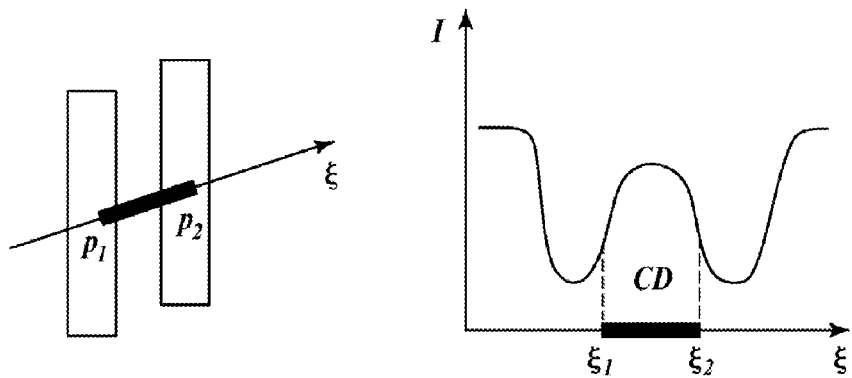
FIGS. 8A and 8B illustrate a gauge placed between adjacent features and corresponding measured image intensities.
FIG. 9 illustrates modeling layers used in accordance with an embodiment of the present invention.

In yet another embodiment of the invention, calibration is done using measurements from a simulated or actual printing of a test pattern on a wafer. In this case, the measurement points using the gauges described above can also be generated using measurements made with, for example, a scanning electron microscope (SEM) from test wafers printed using particular test pattern features. In this case, the SEM image is typically digitized, and the analysis proceeds using the digitized SEM image data instead of the simulated result. As shown in FIGS. 8A and 8B, a gauge specifies a location on the layout where CD measurement is taken. The aerial image is simulated along the gauge and an attempt is made to fit CD into it assuming that the thresholds on the left (point $p_1$) and right (point $p_2$) along the gauge coordinate $\xi$ are the same.

The coordinates $\xi_1$ and $\xi_2$ of $p_1$ and $p_2$ are determined where the left and right side of the measured SEM edge were supposedly positioned during the CD measurement process. We know that $\xi_2-\xi_1=CD$, but the exact values of $\xi_1$ and $\xi_2$ are not known. N gauges yield 2N measurement locations $p_j$. The resist surface function is therefore to be intersected by the threshold at the points $p_j$:

$$R(p_j) - T = 0 \tag{32}$$

or $$\sum_i c_i M_{ij} - T = 0, \tag{32a}$$

where $M_{ij}=M_i(p_j)$. If T is considered a calibration parameter, then this is a linear homogeneous system of equations with a useless trivial solution $c_i=0$, $T=0$. This solution has no modulation, so that the equation is satisfied not only at the points $p_j$, but everywhere. To enforce modulation, it is required that the model profile have specified modulation in the vicinity of the printed edges:

$$\|R'(x, y)\| = a > 0 \tag{33}$$

or $$\left( \sum_j c_j M_j'(x, y), \sum_k c_k M_k'(x, y) \right) = a^2 \tag{34}$$

where prime denotes the derivative of the model term along the gauge direction. To compute the norm, only the vicinity of the printed edges are accounted for. Specifically, let $p_j$ and $p_{j+1}$ be the locations of the left and right edge on a gauge, and let $CD_j$ be the printed CD, i.e., the distance between points $p_j$ and $p_{j+1}$. Let $q_j$ and $r_j$ be points lying on the same gauge at the distance of $0.1*CD_j$ from the point $p_j$, one on each side of the printed edge. The inner product used in equation (3) is defined as a weighted sum of integrals along the segments lying on gauges in the vicinity of the printed edges. The segment for edge j is going from $q_j$ to $r_j$, so that the edge itself is located in the middle of the segment, and the length of each segment is 20% of the respective CD. The inner product is then defined as $$(A, B) = \sum_j \left[ w_j * \int_{q_j}^{r_j} A(\xi) B(\xi) d\xi \right] \tag{35}$$

Here weights $w_j$ are actually halves of the gauge weights, because each gauge has 2 edges.

The objective function for minimization is defined as $$F(c_j, T) = \sum_i w_i * \left[ \left( \sum_j c_j M_j(x_i) \right) - T \right]^2 \tag{36}$$

It is rewritten in a different basis, which is more appropriate. The Gram matrix D of model term derivatives is formed:

$$D_{ij} = (M_i', M_j') \tag{36a}$$

D is a symmetric positive semidefinite matrix. It is diagonalized, and its eigenvectors and eigenvalues are found:

$$Du_i = \lambda_i u_i \tag{36b}$$

The eigenpairs whose eigenvalues are too small are thrown out, and only those eigenpairs for which $\lambda_i \geq \lambda_{min} > 0$ are left for consideration. Now the modified resist simulator terms are introduced in the following way: let eigenvector $u_i$ have components $(a_i^1, a_i^2, \ldots, a_i^N)$ then the modified model term $N_i$ is defined as $$N_i(x, y) = \frac{1}{\sqrt{\lambda_i}} \sum_j a_i^j M_j(x, y) \tag{37}$$

These modified model terms have orthonormal derivatives in the sense of equation (4): $(N_i', N_j')=\delta_{ij}$. The model is rewritten in terms of $N_i$'s:

$$\tilde{R}(x, y) = \left( \sum_j b_j N_j(x, y) \right) - T \tag{37a}$$

and the modified objective function is $$G(b_j, T) = \sum_i w_i * \left[ \left( \sum_j b_j N_j(x_i) \right) - T \right]^2 \tag{38}$$

Coefficients $c_j$ of the original model are expressed in terms of $b_j$ as $$c_j = \sum_k \frac{a_k^j b_k}{\sqrt{\lambda_k}} \tag{39}$$

Differentiating (38) with respect to T, keeping coefficients $b_j$ fixed, the threshold is $$T = \sum_j b_j \overline{N}_j \tag{39a}$$

where the average $$\overline{N}_j = \sum_i w_i N_j(p_i) \tag{39b}$$

(assuming that the weights have been renormalized so that their sum is equal to 1). Plugging the expression for the threshold into equation (38), the final form for the objective function is obtained:

$$H(b_j) = \sum_i w_i * \left[ \sum_j b_j (N_j(x_i) - \overline{N}_j) \right]^2 \tag{40}$$

Equation (40) represents a quadratic form with respect to the coefficients $b_j$:

$$H(b_j) = b^T H b \qquad (40a)$$

where matrix H is symmetric positive semidefinite. The matrix H is diagonalized, its eigenvectors are converted to the original basis via equation (39), and thresholds are computed for each eigenvector. The resulting vectors $s_i$ are rescaled to satisfy the normalization conditions $s_i^T D s_i = a^2$. This way a number of models is obtained, and each of the models has the required modulation in the edge regions. CDRMS error is computed for each of these models, and the model with the lowest CDRMS error is chosen.

The resulting model depends strongly on the parameter $\lambda_{min}$, which determines the number of modified model terms (or eigenvectors of D) included in the minimization. In one embodiment, the value $\lambda_{min} = 10^{-6} - 10^{-8}$ has been found to lead to the lowest CDRMS error, perhaps to overfitting.

File Format

In one embodiment, the resist simulator of the present invention is implemented in a file format where each line starts with a keyword or the comment #. The keywords are version—a fixed number, (e.g. 1, 2, ..., 5,).

modelType—a string, such as "CM1".

DEFINE—a variable length line to define a modeling term. The format is:

DEFINE M<i>[+|−]b=<b>k=<k>n=<n>s=<s>p=<p> where

<i> is a term number, starting from 0;

<b> is value of the neutralization parameter b, default is 0. Explicit plus or minus sign must be specified in front of b;

<k> is value of the parameter k, default is 0;

<n> is value for the parameter n, default is 1;

<s> is diffusion length in nm, default is 0;

<p> is G-L base order, default is 0.

MCOEF—coefficient $c_i$ of the model for $i \geq 0$; number of coefficients must be exactly equal to the number of DEFINE statements.

THRESHOLD—value of the constant term T.

ANCHOR—integer value, index of the anchoring term.

COEFMAX—regularization constant $c_{max}$.

EXAMPLE

Comments are here
version 5
modelType CM1
DEFINE M0 +b=0.1 n=1 s=40 p=0
DEFINE M1 −b=0.2 k=1 n=2 s=33
DEFINE M2 s=10
ANCHOR 0
COEFMAX 0.2
THRESHOLD 0.25
MCOEF 0 1
MCOEF 1 0.01
MCOEF 2 −0.01

Calibration Templates

In one embodiment of the invention, the software that implements the resist simulator uses calibration templates for ease of use. The templates specify which b and s and in what range have to be calibrated. Format:

```
OPTIMIZE {
  <row> <par name> <constraint> <enable_flag> <begin> <end>
  <levels> <best>
  . . .
}
```

The rows are numbered starting from 1.

Methodological Remarks

At the lowest level of interpretation, the resist simulator $$\sum_i c_i M_i(I) = T \qquad (41)$$

is just a mathematical calculation engine, with no or little intrinsic physical meaning. To give the model meaning as it applies to predicting the behavior of resist layers on a wafer, simulation blocks, which combine related physical parameters, are put onto the simulator. In the resist simulator according to one embodiment of the present invention, blocks that model various physical aspects of resist processing are combined into templates for ease of use at the highest, engineering level, as shown in FIG. 9.

In one embodiment of the invention, image intensity is represented by the modeling term with +b=0, k=0, s=0, n=1, p=0:

$$((\nabla^0 I_{+0})^1 \otimes G_{0,0})^1 = I(x, y). \qquad (42)$$

This includes just one modeling term, which represents image intensity, equated to the threshold value $$I(x,y) = T. \qquad (42a)$$

This embodiment therefore corresponds to the Constant Threshold Resist (CTR) model.

In another embodiment, a diffused aerial image is represented by parameter settings +b=0, k=0, s>0, n=1, p=0:

$$((\nabla^0 I_{+0})^1 \otimes G_s)^1 = I(x,y) \otimes G_s \qquad (43)$$

One example of using this term is Double Gaussian Diffusion model:

$$c_0 I(\vec{x}) G_{s0} + c_1 I(\vec{x}) G_{s1} = T \qquad (44)$$

with diffusion lengths s0 and s1. This can correspond to flare and other image scattering phenomena.

In another embodiment, acid concentration after initial neutralization by the quencher with concentration b is represented by parameter settings +b>0, k=0, s=0, n=1, p=0:

$$((\nabla^0 I_{+b})^1 \otimes G_0)^1 = I_{+b} \qquad (45)$$

In another embodiment, neutralized and diffused acid may be represented by parameter settings +b>0, k=0, s>0, n=1, p=0:

$$((\nabla^0 I_{+b})^1 \otimes G_s)^1 = I_{+b} \hat{\times} G_s. \qquad (46)$$

This term can be viewed as corresponding to a diffused acid model:

$$I_{+b} \otimes G_s = T \qquad (47)$$

In another embodiment, base concentration after initial neutralization with acid may be represented by parameter settings −b>0, k=0, s=0, n=1, p=0:

$$((\nabla^0 I_{-b})^1 \otimes G_0)^1 = I_{-b} \quad (48)$$

In another embodiment, neutralized and diffused base concentration may be represented by parameter settings −b>0, k=0, s>0, n=1, p=0

$$((\nabla^0_{-b})^1 \otimes G_s)^1 = I_{-b} \otimes G_s \quad (49)$$

The modelform that includes diffused acid and base is:

$$c_0 I_{+b0} \otimes G_{s0} + c_1 I_{-b1} \otimes G_{s1} = T \quad (50)$$

Image slope is important in explaining horizontal propagation effects during resist development (see models by Tim Brunner of IBM). In accordance with one embodiment of the invention, the image slope is calculated with parameter settings +b=0, k=1, s=0, n=1, p=0:

$$((\nabla^1 I_{+0})^1 \otimes G_0)^1 = |\nabla I| \quad (51)$$

Applying convolution to the image slope yields a modeling term that can be thought of as "the average image slope" +b=0, k=1, s>0, n=1, p=0:

$$((\nabla^1 I_{+0})^1 \otimes G_s)^1 = I \otimes G_s. \quad (52)$$

Exact mathematical expressions for the surface curvatures are complicated and non-linear. In one embodiment, the word "curvature" denotes a sum of second derivates. The image curvature is expressed as a modeling term with parameter settings +b=0, k=2, s=0, n=1, p=0:

$$((\nabla^2 I_{+0})^1 \otimes G_0)^1 = \nabla^2 I = \Delta I = \frac{\partial^2}{\partial x^2} I + \frac{\partial^2}{\partial y^2} I \quad (53)$$

By convolving curvature with Gaussian kernel, "the average curvature" is calculated by the modeling term with parameter settings +b=0, k=2, s>0, n=1, p=0:

$$((\nabla^2_{+0})^1 \otimes G_s)^1 = \Delta I \otimes G_s \quad (54)$$

This term may be relevant for the analysis of line end pull-back effects.

In the resist simulator described above, the image maximum (referred to as Imax in some modeling descriptions) cannot be represented by the modeling terms exactly, however an analogical continuous parameter "smooth Imax" with parameter settings +b=0, k=0, s>0, n=2, p=0 can be defined as follows:

$$((\nabla^0 I_{+0})^2 \otimes G_s)^{1/2} = \sqrt{I^2 \otimes G_s}. \quad (55)$$

Experiments have shown that with power n equal to n=3 often explains CD data better than n=2. Setting n=3 can also be interpreted as a "smooth Imax", and is actually a better approximation to the real Imax definition, as will be clear from the explanations below.

Figure 10:
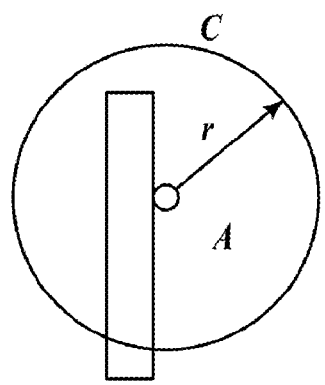
FIG. 10 illustrates a search technique for finding a maximum image intensity.

Consider point of interest (POI) A. To find Imax at this point, we have to limit the search range by a circle C of radius r as shown in FIG. 10.

Consider now the following expression with the integral over the searching circle:

$$\left( \int_C \int |I(x,y)|^n dx dy \right)^{1/n} \quad (56)$$

This expression can be converted to a functional n-norm if the integration is extended to infinity and multiplied by the "tophat" kernel T, which is 1 inside the circle C and 0 outside of it:

$$\left( \int_C \int |I(x,y)|^n dx dy \right)^{1/n} = \quad (57)$$
$$\left( \int_\infty \int |I(x,y)|^n T(x,y) dx dy \right)^{1/n} = \|I(x,y)T(x,y)\|_n$$

This norm converges to the maximum of I(x,y) in the circle C when n is increased to infinity, because infinity norm of a positive function is its maximum value:

$$\|I(x,y)T(x,y)\|_\infty = \max|I(x,y)T(x,y)| = \max|I(x,y)| = I_{max} \quad (58)$$

This equality is relaxed by setting n=2 and replacing tophat kernel by the Gaussian kernel of the diffusion length s=r:

$$I_{max} \approx \|I(x,y)G_s(x,y)\|_2 = \left( \int_\infty \int |I(x,y)|^2 G_s(x,y) dx dy \right)^{1/2} \quad (59)$$

By moving POI around, a continuous Imax distribution is obtained as a function of POI coordinates x and y, while the integral above becomes a convolution operation:

$$I_{max}(x,y) \approx \left( \int_\infty \int |I(\xi,\eta)|^2 G_s(x-\xi, y-\eta) d\xi d\eta \right)^{1/2} = \sqrt{I^2 \otimes G_s}. \quad (60)$$

If n is increased from 2 to 3, then the following expression will approximate Imax even better:

$$I_{max}(x,y) \approx \sqrt[3]{I^3 \otimes G_s}. \quad (61)$$

Modeling term using parameter settings +b>0, k=0, s>0, n=2 or 3, p=0 is considered to be "a smooth maximum acid":

$$((\nabla^0 I_{+b})^2 \otimes G_s)^{\frac{1}{2}} = \sqrt{I^2_{+b} \otimes G_s} \quad (62)$$

or $$((\nabla^0 I_{+b})^3 \otimes G_s)^{\frac{1}{3}} = \sqrt[3]{I^3_{+b} \otimes G_s} \quad (63)$$

This is different from Imax by an extra neutralization operation.

Figure 11:
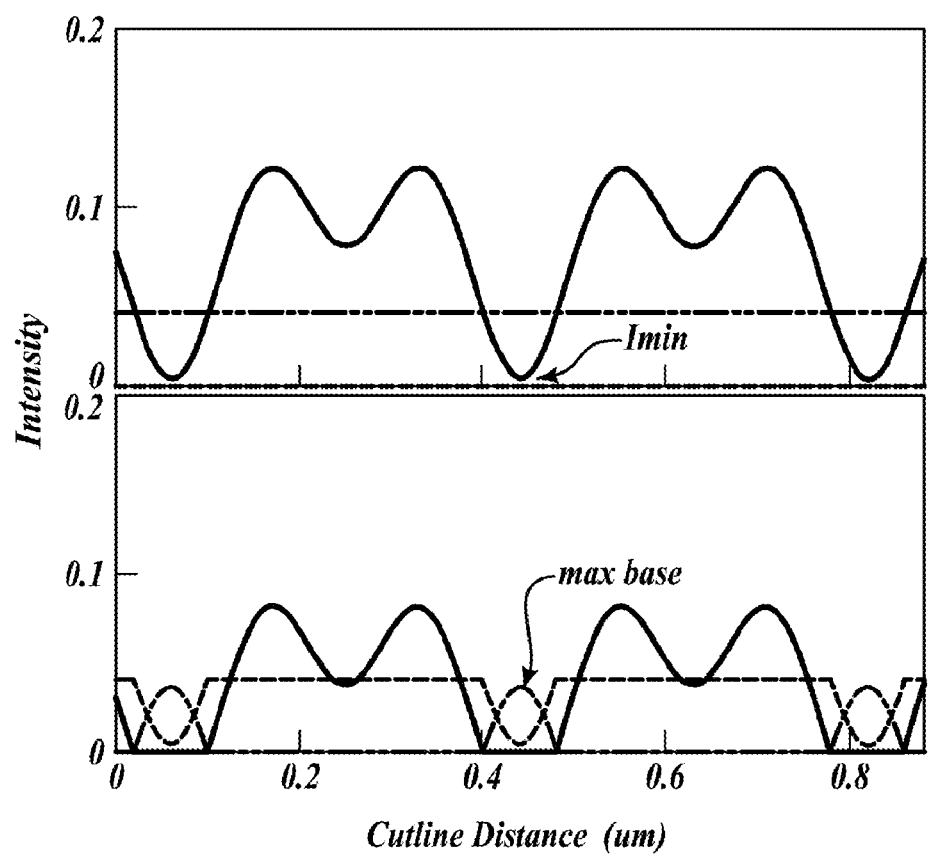
FIG. 11 illustrates a relationship between minimum image intensity and maximum base concentration.

The parameter Imin characterizes an image at the locations that correspond to the maximum of the base concentration. Image intensity gets "flipped" by neutralization, as shown in FIG. 11, where Imin corresponds to maximum base concentration. "Smooth maximum base" may be described by parameter settings −b>0, k=0, s>0, n=2 or 3, p=0:

$$((\nabla^0 I_{-b})^2 \otimes G_s)^{\frac{1}{2}} = \sqrt{I^2_{-b} \otimes G_s} \quad (64)$$

or $$((\nabla^0 I_{-b})^3 \otimes G_s)^{\frac{1}{3}} = \sqrt[3]{I^3_{-b} \otimes G_s} \quad (65)$$

Modelforms

Implementations of the resist simulator of the present invention use a number of modelforms that are numbered starting from 0. The indices 0 . . . 9 are reserved for simple and widely used models with one or two terms. Modelforms at and above 100 combine G-L bases with other terms.

Each modelform has an associated calibration template. These are presented in the following format

```
OPTIMIZE {
    <par #> <par name> <constraint> <enabled> <begin> <end>
    <levels> <best value>
    . . .
}
``` which is also used by a graphical user interface (GUI) of the resist simulator CM1 Center.

Here:
    <par #>—parameter count starting from 1.
    <par name>—parameter name. Example: "s5".
    <constraint>—tcl expression that is passed to modelflow to define constraint. If constraint not present, the "NA" is specified.
    <enabled>—flag to enable parameter with possible values 0 or 1.
    <begin>—left end of the optimization interval.
    <end>—right end of the optimization interval.
    <levels>—number of optimization levels to be passed to modelflow.
    <best value>—an estimate of what value might be the best one, which is not used for optimization results, just for the GUI display.

Modelform 0

This is continuous threshold resist (CTR) model $$I(x,y)=T \quad (65a)$$

Modelform 1

A diffused aerial image model can be given by $$I(\tilde{x})G_s=T \quad (65b)$$

Using a calibration template of:

```
OPTIMIZE {
    1 s0 NA 1 0 100 5 25
}
```

Modelform 2

A diffused acid model can be given by $$I_{+b}(\tilde{x})G_s=T \quad (65c)$$

Using a calibration template of:

```
OPTIMIZE {
    1 s0 NA 1 0 100 5 25
    2 b0 NA 1 0 0.1 5 0.03
}
```

Modelform 3

A double Gaussian diffusion model can be given by $$c_0 I(\tilde{x})G_{s0}+c_1 I(\tilde{x})G_{s1}=T \quad (66)$$

Using a calibration template of:

```
OPTIMIZE {
    1 s0 NA 1 0 50 3 25
    2 s1 NA 1 100 300 3 150
}
```

Modelform 10

A complex modelform with the image intensity as the anchoring term, acid, and bases can be given by:

$$c_0 I+c_1 I_{+b1}(\tilde{x})G_{s1}+c_2 I_{-b2}(\tilde{x})G_{s2}=T \quad (67)$$

Using a calibration template of:

```
OPTIMIZE {
    1 s1 NA 1 0 50 3 25
    2 s2 NA 1 100 300 3 150
    3 b1 NA 1 0 0.1 3 0.03
    4 b2 $b1 1 0 0.1 1 0.03
}
```

Modelform 11

A complex modelform with the image intensity as the anchoring term, double Gaussian acid, and bases can be given by:

$$c_0 I+c_1 I_{+b1}(\tilde{x})G_{s1}+c_2 I_{+b2}(\tilde{x})G_{s2}+c_3 I_{-b3}(\tilde{x})_{s3}=T \quad (68)$$

Using a calibration template of:

```
OPTIMIZE {
    1 s1 NA 1 0 50 3 25
    2 s2 NA 1 100 300 3 150
    3 s3 NA 1 0 100 5 50
    4 b1 NA 1 0 0.1 3 0.03
    5 b2 $b1 1 0 0.1 1 0.03
    6 b3 $b1 1 0 0.1 1 0.03
}
```

Modelform 12

A modelform with 8 orthogonal bases can be given by $$c_0 I+c_1 I(\tilde{x})G_{s1,0}+c_2 I(\tilde{x})G_{s2,1}+c_3 I(\tilde{x})G_{s3,2}+c_4 I(\tilde{x})G_{s4,3}+c_5 I(\tilde{x})G_{s5,4}+ \\ c_6 I(\tilde{x})G_{s6,5}++c_7 I(\tilde{x})G_{s7,6}+c_8 I(\tilde{x})G_{s8,7}=T \quad (69)$$

Using a calibration template of:

```
OPTIMIZE {
    1 s1 NA 1 0 100 7 50
    2 s2 $s1 1 0 100 1 50
    3 s3 $s1 1 0 100 1 50
    4 s4 $s1 1 0 100 1 50
    5 s5 $s1 1 0 100 1 50
    6 s6 $s1 1 0 100 1 50
    7 s7 $s1 1 0 100 1 50
    8 s8 $s1 1 0 100 1 50
}
```

Modelform 20

In addition to modelform 11, modelform 20 has the slope:

$$(70) \quad c_0 I+c_{1+b1}(\tilde{x})G_{s1}+c_2 I_{+b2}(\tilde{x})G_{s2}+c_3 I_{-b3}(\tilde{x})G_{s3}+c_4|\nabla I(\tilde{x})G_{s4}=T$$

Using a calibration template of:

```
OPTIMIZE {
1 s1 NA 1 0 50 3 25
2 s2 NA 1 100 300 3 150
3 s3 NA 1 0 100 5 50
4 s4 NA 1 0 50 3 25
5 b1 NA 1 0 0.1 3 0.03
6 b2 $b1 1 0 0.1 1 0.03
7 b3 $b1 1 0 0.1 1 0.03
}
```

Modelform 21

Modelform 21 adds Imax and Imin to Modelform 20 and can be given by:

$$c_0 I + c_1 I_{+b1}(\vec{x}) G_{s1} + c_2 I_{+b2}(\vec{x}) G_{s2} c_3 I_{-b3}(\vec{x}) G_{s3} + c_4 |\nabla I(\vec{x})| G_{s4} + + c_5 \sqrt{I^2(\vec{x})} G_{s5} + c_6 \sqrt{I_{-b6}^2(\vec{x})} G_{s6} = T \tag{71}$$

Using a calibration template of:

```
OPTIMIZE {
1 s1 NA 1 0 50 3 25
2 s2 NA 1 100 300 3 150
3 s3 NA 1 0 100 5 50
4 s4 NA 1 0 50 3 25
5 s5 NA 1 0 50 3 25
6 s6 NA 1 0 50 3 25
5 b1 NA 1 0 0.1 3 0.03
6 b2 $b1 1 0 0.1 1 0.03
7 b3 $b1 1 0 0.1 1 0.03
8 b6 NA 1 0 0.1 3 0.03
}
```

Modelform 22

Modelform 22 adds curvature to modelform 21:

$$c_0 I + c_1 I_{+b1}(\vec{x}) G_{s1} + c_2 I_{+b2}(\vec{x}) G_{s2} + c_3 I_{-b3} X G_{s3} + c_4 |\nabla I(\vec{x})| G_{s4} + c_5 \sqrt{I^2(\vec{x})} G_{s5} c_6 \sqrt{I_{-b6}^2(\vec{x})} G_{s6} + c_7 \Delta I(\vec{x}) G_{s7} = T \tag{72}$$

Using a calibration template of:

```
OPTIMIZE {
1 s1 NA 1 0 50 3 25
2 s2 NA 1 100 300 3 150
3 s3 NA 1 0 100 5 50
4 s4 NA 1 0 50 3 25
5 s5 NA 1 0 50 3 25
6 s6 NA 1 0 50 3 25
7 s7 NA 1 0 50 3 25
8 b1 NA 1 0 0.1 3 0.03
9 b2 $b1 1 0 0.1 1 0.03
10 b3 $b1 1 0 0.1 1 0.03
11 b6 NA 1 0 0.1 3 0.03
}
```

Modelform 120

Modelform 120 extends modelform 22 with the "black box" modelform 12 orthogonal bases and can be given by:

$$c_0 I + c_1 I_{+b1} \otimes G_{s1} + c_2 I_{+b2} \otimes G_{s2} + c_3 I_{-b3} \otimes G_{s3} + \\ c_4 |\nabla I| \otimes G_{s4} + c_5 \sqrt{I^2 \otimes G_{s5}} + c_6 \sqrt{I^2_{-b6} \otimes G_{s6}} + c_7 \Delta I \otimes G_{s7} + \\ c_8 I \otimes G_{s,0} + c_9 I \otimes G_{s,1} + c_{10} I \otimes G_{s,2} + c_{11} I \otimes G_{s,3} + \\ c_{12} I \otimes G_{s,4} + c_{13} I \otimes G_{s,5} + c_{14} I \otimes G_{s,6} + c_{15} I \otimes G_{s,7} = T \tag{73}$$

Using a calibration template of:

```
OPTIMIZE {
1 s1 NA 1 0 50 3 25
2 s2 NA 1 100 300 3 150
3 s3 NA 1 0 100 5 50
4 s4 NA 1 0 50 3 25
5 s5 NA 1 0 50 3 25
6 s6 NA 1 0 50 3 25
7 s7 NA 1 0 50 3 25
8 s8 NA 1 0 100 11 50
9 s9 $s8 1 0 100 1 50
10 s10 $s8 1 0 100 1 50
11 s11 $s8 1 0 100 1 50
12 s12 $s8 1 0 100 1 50
13 s13 $s8 1 0 100 1 50
14 s14 $s8 1 0 100 1 50
15 s15 $s8 1 0 100 1 50
16 b1 NA 1 0 0.1 3 0.03
17 b2 $b1 1 0 0.1 1 0.03
18 b3 $b1 1 0 0.1 1 0.03
19 b6 NA 1 0 0.1 3 0.03
}
```

Modelform 130

Modelform 130 is the same as modelform 120, but with power n=3 for $I_{min}$ term and can be defined as follows:

$$c_0 I + c_1 I_{+b1} \otimes G_{s1} + c_2 I_{+b2} \otimes G_{s2} + c_3 I_{-b3} \otimes G_{s3} + \\ c_4 |\nabla I| \otimes G_{s4} + c_5 \sqrt{I^2 \otimes G_{s5}} + c_6 \sqrt[3]{I^3_{-b6} \otimes G_{s6}} + c_7 \Delta I \otimes G_{s7} + \\ c_8 I \otimes G_{s,0} + c_9 I \otimes G_{s,1} + c_{10} I \otimes G_{s,2} + c_{11} I \otimes G_{s,3} + \\ c_{12} I \otimes G_{s,4} + c_{13} I \otimes G_{s,5} + c_{14} I \otimes G_{s,6} + c_{15} I \otimes G_{s,7} = T \tag{74}$$

Using an optimization of:

```
OPTIMIZE {
1 s1 NA 1 0 50 3 25
2 s2 NA 1 100 300 3 150
3 s3 NA 1 0 100 5 50
4 s4 NA 1 0 50 3 25
5 s5 NA 1 0 50 3 25
6 s6 NA 1 0 50 3 25
7 s7 NA 1 0 50 3 25
8 s8 NA 1 0 100 11 50
9 s9 $s8 1 0 100 1 50
10 s10 $s8 1 0 100 1 50
11 s11 $s8 1 0 100 1 50
12 s12 $s8 1 0 100 1 50
13 s13 $s8 1 0 100 1 50
14 s14 $s8 1 0 100 1 50
15 s15 $s8 1 0 100 1 50
16 b1 NA 1 0 0.1 3 0.03
17 b2 $b1 1 0 0.1 1 0.03
18 b3 $b1 1 0 0.1 1 0.03
19 b6 NA 1 0 0.1 3 0.03
}
```

The resist simulator of the present invention may be implemented on a stand alone or networked computer system. A computer-readable medium, such as CD-ROM, DVD, solid state memory, or computer communication link, provides a number of instructions that are executed by the computer(s) to simulate how a mask pattern will print on a wafer. From the estimate of how the mask pattern will print, one or more resolution enhancement techniques, such as OPC, subresolution assist features (SRAFs) or phase-shifting mask features, can be used in order to produce mask pattern data that will be used to print the desired layout on a wafer.

Computational Complexity

Let N be a grid size of a frame. There are $N^2$ pixels in the simulation square. For N=256 and 30 nm pixel size this accounts for $N^2$=65536 pixels in 7.68 um by 7.68 um frame. Counting only multiplication flops, it is estimated that a square root takes 20 flops, and an exponent takes 40 flops, based on a Sun Solaris test and some references from the Web. NASA Advanced Supercomputing (NAS) standards call for the different flop count (see the table below).

| Operation | NAS | Our Sun test | This study |
|---|---|---|---|
| non-isolated assignment, indexing | 0 | | 0 |
| multiply | 1 | 1 | 1 |
| add, subtract | 1 | | 0 |
| isolated assignment | 1 | | 1 |
| comparison | 1 | | 1 |
| type conversion | 1 | | 1 |
| division | 4 | 4 | 4 |
| sqrt | 4 | 20 | 20 |
| sin, exp, etc. | 8 | 40 | 40 |

The Fast Fourier Transform (FFT) algorithm requires $$F_{fft} = 10N^2 \log_2 N \quad (75)$$

flops for the complex-valued FFT and $$F_{fft} = 5N^2 \log_2 N \quad (76)$$

flops for the real-valued FFT. Taking N=256 produces the following estimate for the real FFT:

$$F_{fft} = 40N^2. \quad (77)$$

The test of FFT performance on Intel Pentium gave 90 ms for N=481. Calculating flops produces:

$$F_{fft} = 5(481)^2 \log_2 481 = 10 \text{ Mflops}. \quad (78)$$

At 1 GFLOPS CPU speed this gives us 10 ms.

Operations

Some operations are done on an up sampled grid. The up sampling factor u is usually 4. The upsampled grid has the size $$\overline{N} = u \cdot N \quad (79)$$

Neutralization

If b=0, then neutralization is skipped. When b>0, the neutralization is one subtraction (0 flops) and one comparison (1 flop), thus the flop count is $$F_{neutral} = (b>0)\overline{N}^2. \quad (80)$$

In one embodiment, $\overline{N}$ is used, because this operation is always done on an upsampled grid. Smooth neutralization is one multiplication, square root, and division by 2 (see formula (2)). The division can be combined with the term coefficient $c_i$, so it is ignored. The flop count for the smooth neutralization:

$$F_{sneutral} = 21(b>0)\overline{N}^2. \quad (81)$$

Derivatives

Derivatives are calculated in the spectral domain. The first derivative is calculated on an upsampled grid, and the second derivative is done on the Nyquist grid.

Second derivatives are calculated as the following:
forward FFT
calculation of $-k_x^2$ and $-k_y^2$
multiplication of the real and imaginary parts of the spectrum by $-k_x^2$ and $-k_y^2$
inverse FFT In more detail, the forward FFT of the original function f(x, y) gives the spectrum of for a two-dimensional grid. This spectrum $F(k_x,k_y)$ is a complex-valued function of the two-dimensional wave vector $(k_x;k_y)$. After the forward FFT, $F(k_x,k_y)$ is multiplied by the quantity $-(k_x^2+k_y^2)$, giving the spectrum of the laplacian of the original function $G(k_x, k_y) = -(k_x^2+k_y^2)*F(k_x,k_y)$. Since original function is band-limited, its laplacian is band-limited, too, with the same Nyquist rate, which allows us to compute it accurately on the original (Nyquist) grid. Inverse FFT of the spectrum $G(k_x, k_y)$ of the laplacian $$\Delta f(x, y) \equiv \frac{\partial^2 f(x, y)}{\partial x^2} + \frac{\partial^2 f(x, y)}{\partial y^2}$$

gives the laplacian of the original function in real space.
The flop count is as following:

$$F_{deriv2} = (k = 2)\lfloor 5N^2 \log_2 N + 2N + 2N^2 + N^2 + N^2 + \quad (82)$$
$$N^2 + 5N^2 \log_2 N \rfloor = (k = 2)[10N^2 \log_2 N + 5N^2 + 2N] \approx$$
$$10(k = 2)[\log_2 N + 0.5]N^2$$

In one embodiment of the invention, the slope (first derivative) is calculated using FFTs on Nyquist and upsampled grids in the following way:
forward FFT of the original function on the Nyquist grid
multiply the spectrum of the original function by $ik_x$ (complex multiplication), putting the result of multiplication to buffer buffer1
multiply the spectrum of the original function by $ik_y$ (complex multiplication),
putting the result of multiplication to buffer buffer2
paste buffer1 onto the upsampled Fourier grid
inverse FFT of buffer1 on the upsampled grid, result is put to the real space array grad on the upsampled grid
paste buffer2 onto the upsampled Fourier grid
inverse FFT of buffer2 on the upsampled grid, result is put to the real space array temp on the upsampled grid
square the array grad, putting result back to grad
add square of temp to grad
compute square root of grad to obtain the absolute value of the gradient In more detail, the forward FFT of the original function f(x, y) gives the spectrum of fon a two-dimensional grid. This spectrum $F(k_x,k_y)$ is a complex-valued function of the two-dimensional wave vector $(k_x; k_y)$. After the forward FFT two new complex-valued functions in the Fourier domain are computed: $F_x(k_x, k_y)=i*k_x*F(k_x,k_y)$ and $F_y(k_x,k_y)=i*k_y*F(k_x,k_y)$. $F_x$ and $F_y$ are the spectra of the X and Y derivatives of the original function f, respectively. Since fis a band-limited function, its derivatives are also band-limited with the same Nyquist rate, and therefore $F_x$ and $F_y$ give accurate spectral representations of the first derivatives of f. However, squaring increases the maximal frequency in the spectrum, while square root destroys the band-limited property. Therefore, to accurately compute the absolute value of the gradient $$|\vec{\nabla} f(x,y)| \equiv \sqrt{\left(\frac{\partial f(x,y)}{\partial x}\right)^2 + \left(\frac{\partial f(x,y)}{\partial y}\right)^2}, \qquad (83)$$

the inverse FFT cannot be computed on the original grid and has to be done on the upsampled grid. Therefore, the spectra $F_x$ and $F_y$ are pasted onto the upsampled grid by adding zero values at larger frequencies. Inverse FFTs of $F_x$ and $F_y$ then give first derivatives $$\frac{\partial f(x,y)}{\partial x} \text{ and } \frac{\partial f(x,y)}{\partial y}$$

on the upsampled grid, after which the absolute value of the gradient $$|\vec{\nabla} f(x,y)| \equiv \sqrt{\left(\frac{\partial f(x,y)}{\partial x}\right)^2 + \left(\frac{\partial f(x,y)}{\partial y}\right)^2}$$

is computed on the upsampled grid.

The flop count is a more complicated expression:

$$F_{derv1} = 5N^2 \log_2 N + 2(N^2 + \overline{N}^2) + 2(5\overline{N}^2 \log_2 N) + 3\overline{N}^2 + 20\overline{N}^2 = \qquad (84)$$
$$5N^2 \log_2 N + 2N^2 + 25\overline{N}^2 + 10\overline{N}^2 \log_2 \overline{N}$$

Final expression is $$F_{derv1} = (k=1)\{5(2\log_2 \overline{N}+5)\overline{N}^2 + (5 \log_2 N + 2(N^2)\} \qquad (85)$$

Squaring

Squaring is defined by the parameter n=1 or 2. Squaring is one multiplication on an upsampled grid, so $$F_{square} = (n>1)\overline{N}^2 \qquad (86)$$

Convolution

Convolution is performed on a real function, with a real kernel, only when s>0. The grid can be upsampled or not depending on other parameters. We use $\hat{N}$ for the convolution grid:

$$\hat{N} = \begin{cases} N, & b=0 \wedge (k=0 \vee k=2) \wedge n=0 \\ \overline{N}, & b>0 \vee k=1 \vee n>0 \end{cases} \qquad (87)$$

An FFT is done for the function, which is multiplied by the pre-calculated kernel spectrum, and then an inverse FFT is performed. The total flop count is:

$$F_{convolution} = (s>0)(5\hat{N}^2 \log_2 \hat{N} + \hat{N}^2 + 5\hat{N}^2 \log_2 \hat{N}) = 10(s>0)(\log_2 \hat{N}+0.1)\hat{N}^2. \qquad (88)$$

Square Root

Square root is taken only when n=2 and only on the upsampled grid, so the flop count is:

$$F_{root} = 20(n>1)\overline{N}^2. \qquad (89)$$

Scaling

Each modeling term is multiplied by the scaling factor $c_i$, so that scaling takes $$F_{scaling} = \hat{N}^2 \qquad (90)$$

flops.

Upsampling

Figure 20:
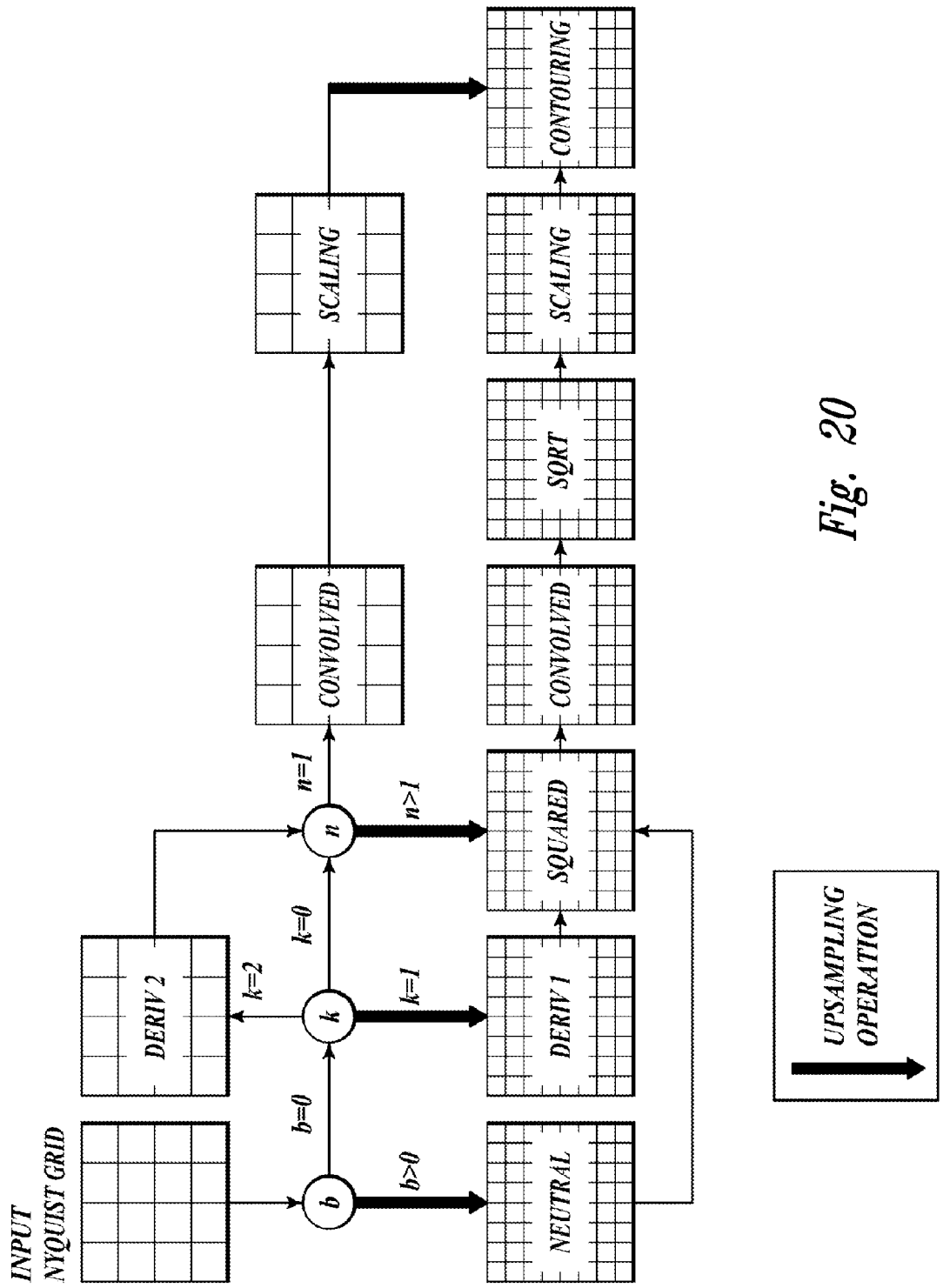
FIG. 20 illustrates a flow chart for improving speed in a resist simulator in accordance with one embodiment of the present invention.

One operation of upsampling is required to map the results into the contouring grid. It is desirable to delay the upsampling to be as late in the computation as possible, evaluating each parameter in turn and the need for upscaling in the order as, for example, presented in FIG. 20. Here, first b, then k, then n are determined. Only if b>0, k=1, or n>1 does upsampling proceed earlier in the process; otherwise the other required operations are carried out at the lower sampling grid, and upsampling is then carried out just before the last step of contouring. The operations for upsampling use forward FFT on Nyquist grid
zero-padding
backward FFT on the upsampled grid $$F_{upsampling} = 10N^2 \log N + \overline{N}^2 + 10\overline{N}^2 \log \overline{N} = 10N^2 \log N + 10\overline{N}^2 (\log \overline{N}+0.1). \qquad (91)$$

Total Flop Count

The total flop count is the sum of all operations:

$$F_{total} = \qquad (92)$$
$$\sum_i (F_{i,netral} + F_{i,derv1} + F_{i,derv2} + F_{i,square} + F_{i,convolution} + F_{i,root} +$$
$$F_{i,scaling} + F_{i,upsampling}) =$$
$$\overline{N}^2 \sum_i [(b_i > 0) + 15(k_i = 1)(\log_2 \overline{N} + 2) +$$
$$21(n_i > 1) + 10(\log \overline{N} + 0.1)] +$$
$$N^2 \sum_i [10(k_i = 2)(\log_2 N + 0.2) + 10\log_2 N] +$$
$$\hat{N}^2 \sum_i [10(s_i > 0)(\log_2 \hat{N} + 0.1) + 1]$$

The algorithm has complexity of $N^2$ (if the weak dependence on log N is neglected). For the most complex modelform 120, N=256 and 4× upsampling this gives $$F_{total} = 900 \text{ MFlops} \qquad (93)$$

With this flop count, 20 mm by 20 mm chip, 7.8 by 7.8 um simulation frame, and the CPU speed of 4 GFLOPS, the runtime estimate is 16 days per one CPU.

MODELFORM 120 FLOP COUNT

For optimized implementation of the simulations with modelform 120, the following expression is obtained:

$$F_{total} = 17N^2 + 20N^2 \log_2 N + 61u^2 N^2 60u^2 \log_2(uN) \qquad (94)$$

Here u is the upsampling factor, so that the number of points on the upsampled grid $\overline{N} = uN$. The term $60u^2 N^2 \log_2 (uN)$ comes from the Fourier transforms performed on the upsampled grid. For typical grid sizes N=128 or 256 and upsampling factor u=4 this term dominates the total flop count, accounting for about 90% of the total. The total flop count with N=256 and u=4 is about 700 Mflops.

Grid Analysis

The input into resist simulator of the present invention is I(x,y) on a grid sampled at the sum of coherent systems (SOCS) Nyquist rate. I(x,y) is band-limited, so this sampling is fine enough to restore exact values at any finer grid. Operators used in the resist simulator of the present invention may generate functions that are not band-limited and require upsampling.

Neutralization

Neutralization requires upsampling, because the resulting function is not smooth. Performing neutralization directly on the SOCS Nyquist grid may produce non-accurate results.

Figure 12:
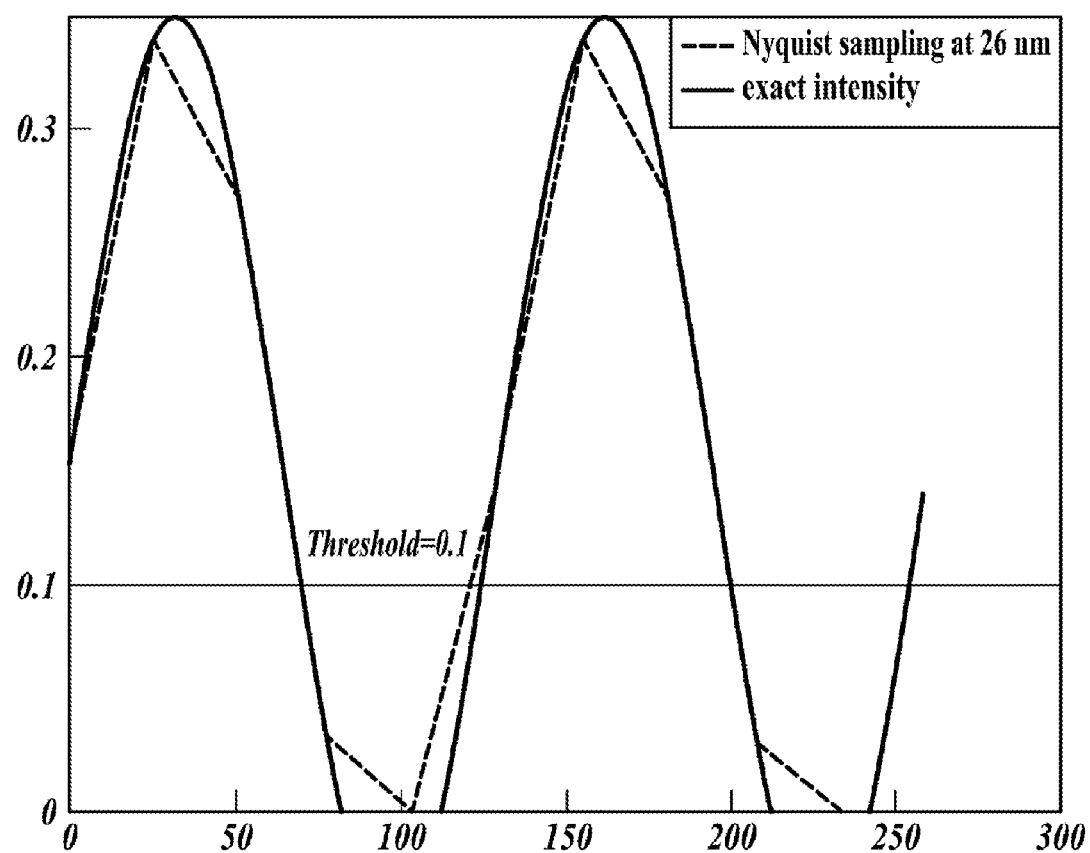
FIG. 12 illustrates image intensity versus a Nyquist sampling grid.

Consider pitch 130 nm, with image intensity approximated by a sin function of Imax=0.4, Imin=0, that is neutralized by b=0.05. The threshold is taken at 0.1. This is depicted in FIG. 12, where one line represents exact image, and the other line is Nyquist sampling at 26 nm. Exact CD at 0.1 threshold is 53.5 nm, Nyquist sampling CD is 50.2 nm. This is a large error of 3.3 nm.

The conclusion is that it is not possible to threshold the Nyquist grid directly. The options are:
1. upsample I, then neutralize
    may be preferable because the upsampled image might already be available upstream
2. neutralize at Nyquist, then upsample using FFT
    $I_{+b}$ is not band-limited, so this is not the best upsampling
    requires 2 FFT
3. neutralize at Nyquist, then upsample using linear/quadratic/cubic interpolation
    $I_{+b}$ is not smooth, so interpolation formulas are not very accurate.

Options 1, then 2, are tried.

The table below shows errors for different upsampling factors of the option 1. Exact CD=53.5 is taken at 0.1 threshold.

| Pixel | Nyquist rate | CD error |
| --- | --- | --- |
| 26 nm | 1x | 3.3 nm |
| 13 nm | 2x | 0.6 nm |
| 6.5 nm | 4x | 0.06 nm |

Figure 13:
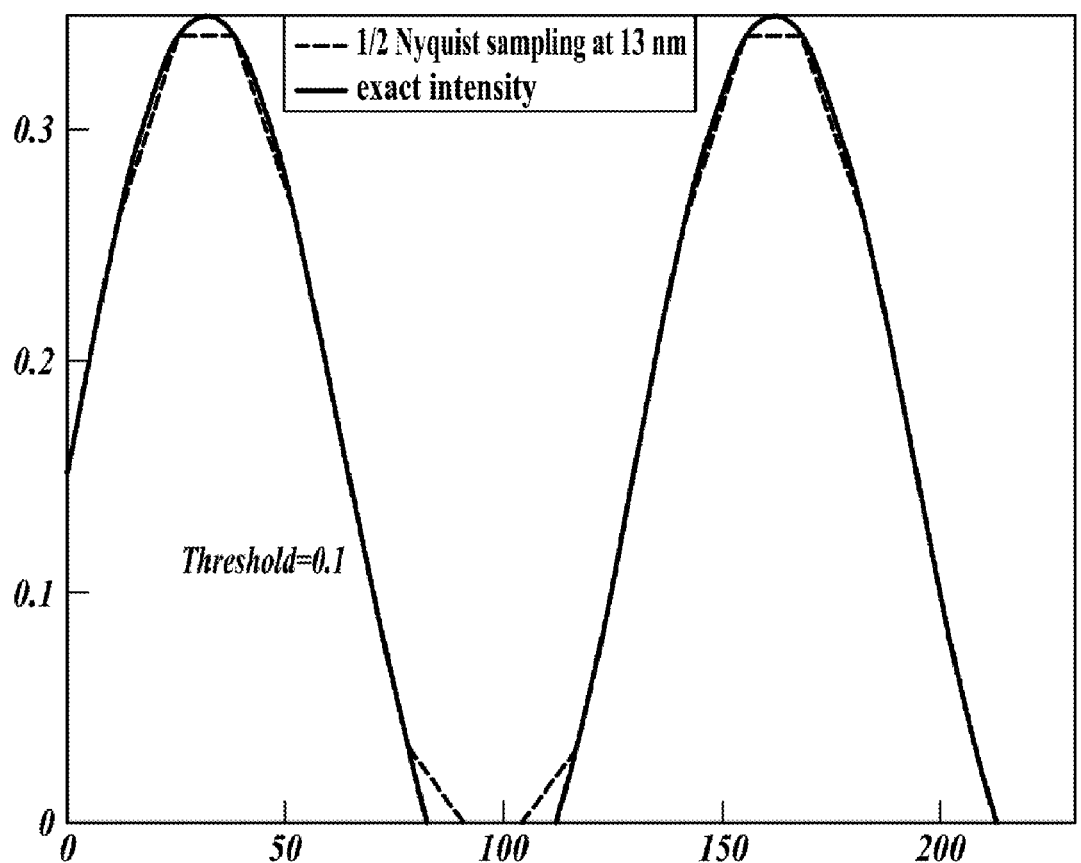
FIG. 13 illustrates image intensity versus upsampling on a Nyquist grid.
Figure 14:
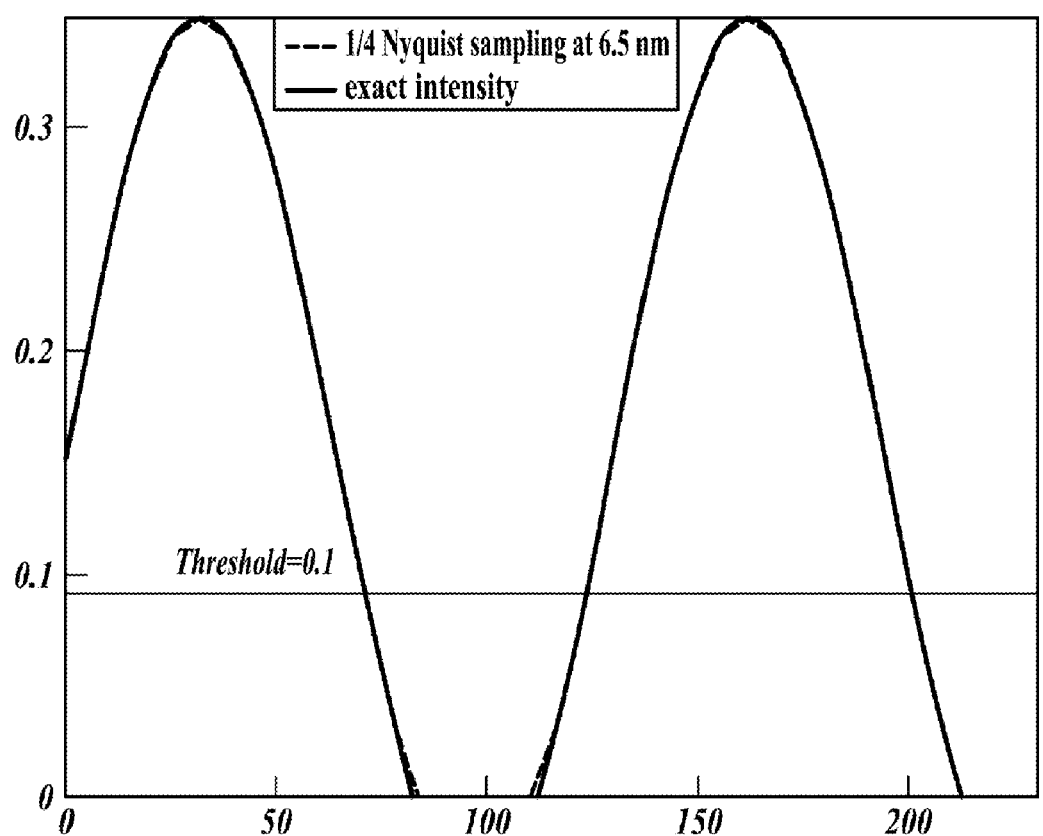
FIG. 14 illustrates image intensity versus further upsampling on a Nyquist grid.
Figure 15:
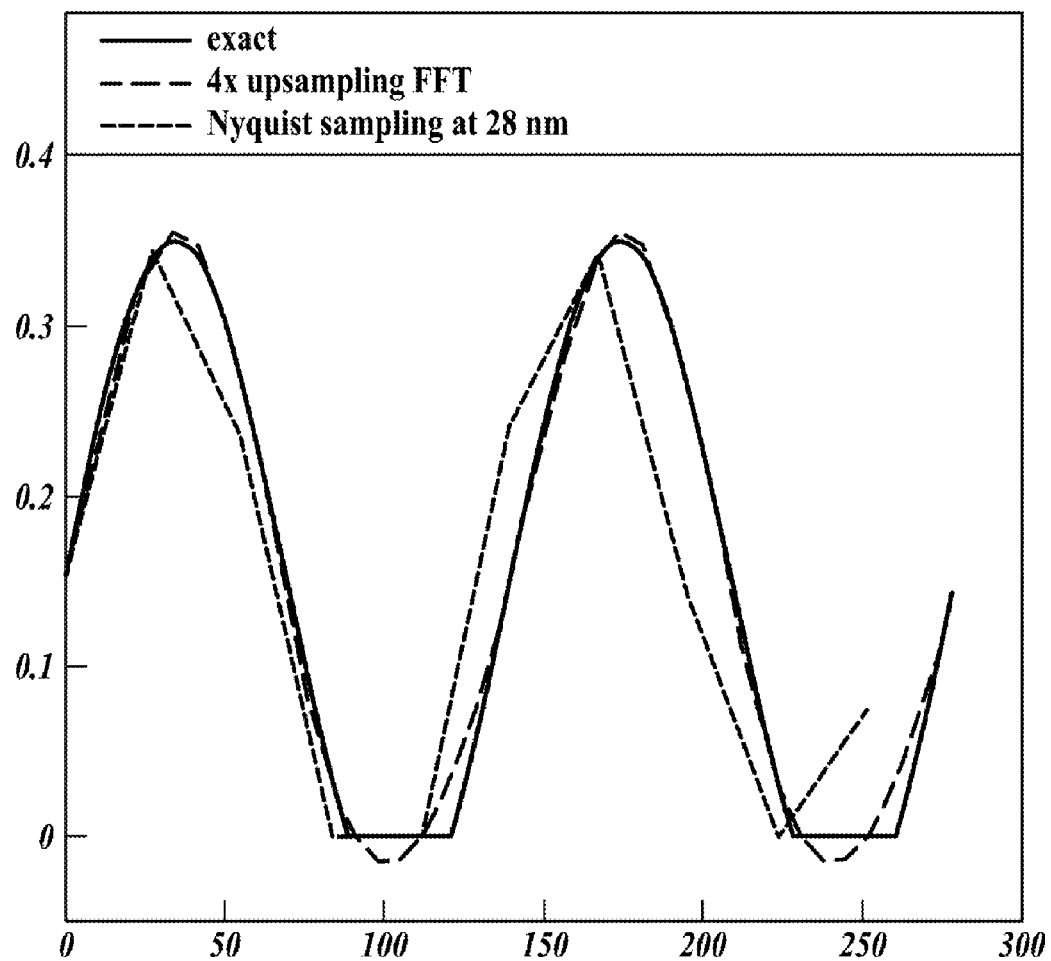
FIG. 15 illustrates image intensity versus upsampling using a Fast Fourier Transform.

4× upsampling delivers error which is below 0.1 nm. FIG. 13 shows that 2× upsampling is very crude. There is a range of thresholds from 0 to 0.03 where the error can be as large as the grid size, 13 nm. FIG. 14 shows 4× upsampling. There is still a dangerous region of low thresholds (from 0 to 0.03), where CD error can be as large as 3 nm.

The second option is to upsample using FFT, neutralizing at the Nyquist grid and upsample by zero-padding frequencies. However, this may not work well. CD error is 2.5 nm, too large for option 2 to be acceptable.

The conclusion is to conduct neutralization on 4× upsampled grid.

Derivatives

The following compares different option of calculating derivatives by:
  a) taking derivatives in space domain using finite differences or
  b) taking derivatives in frequency domain In space domain central finite differences are used as follows $$S = \left|\frac{dI}{dx}\right| \approx \left|\frac{I(x+\Delta x) - I(x-\Delta x)}{2\Delta x}\right|. \quad (95)$$

Figure 16:
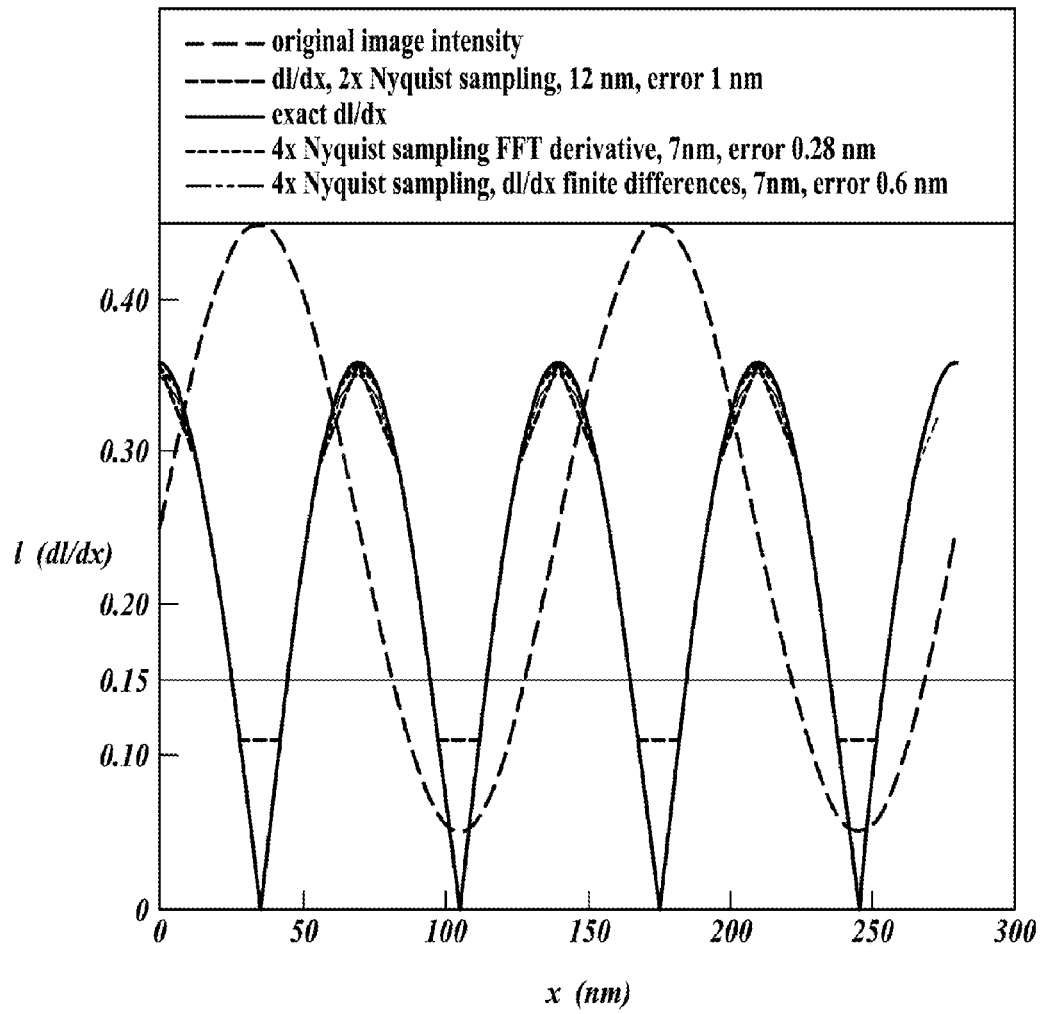
FIG. 16 illustrates image intensity versus different techniques for calculating slope.

In frequency domain, the multiplication of spectrum is used by:
  a) multiply Nyquist spectrum by ik;
  b) zero-pad to 2× or 4× upsampling;
  c) convert back to the space domain; and
  d) take absolute value FIG. 16 compares the results.

CD errors are calculated at 0.15 threshold for exact CD=50.8 nm. The results are set forth in the table below.

TABLE

Slope calculation numerical errors.

| Pixel | Nyquist rate | Method | CD error |
| --- | --- | --- | --- |
| 28 nm | 1x | | |
| 14 nm | 2x | FFT | 1 nm |
| 7 nm | 4x | FFT | 0.28 nm |
| 7 nm | 4x | Finite differences | 0.6 nm |

Figure 17:
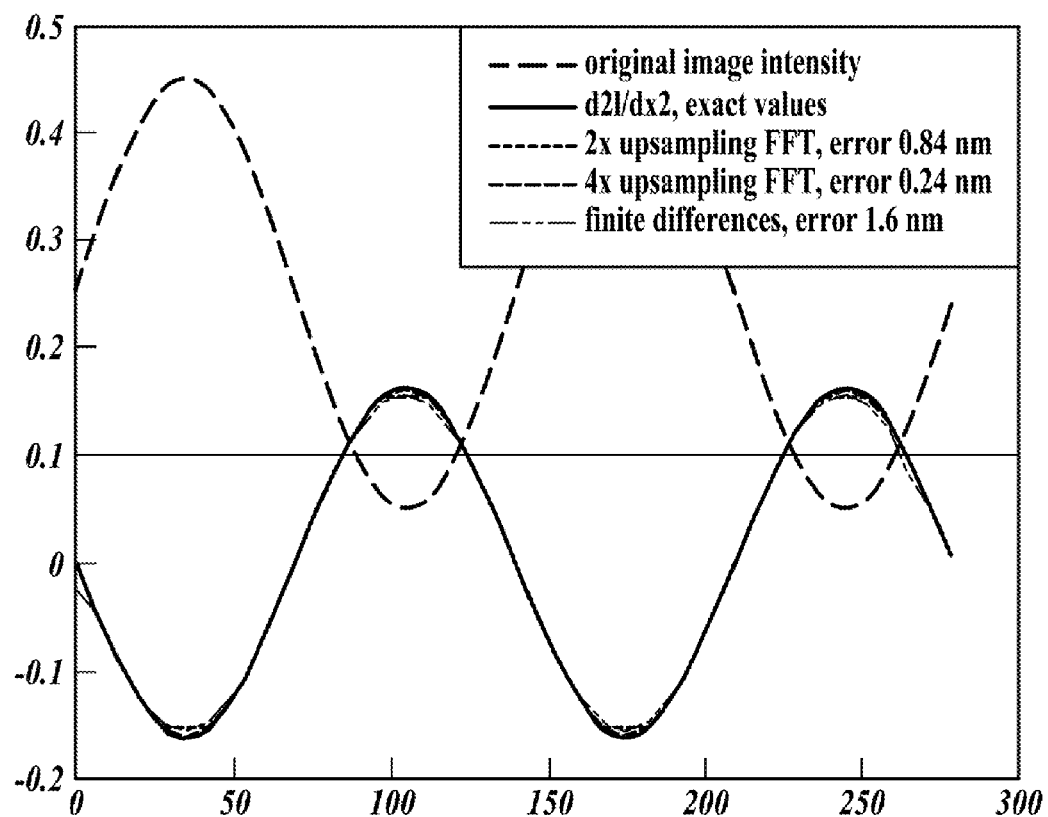
FIG. 17 illustrates image intensity versus curvature calculations.
Figure 18:
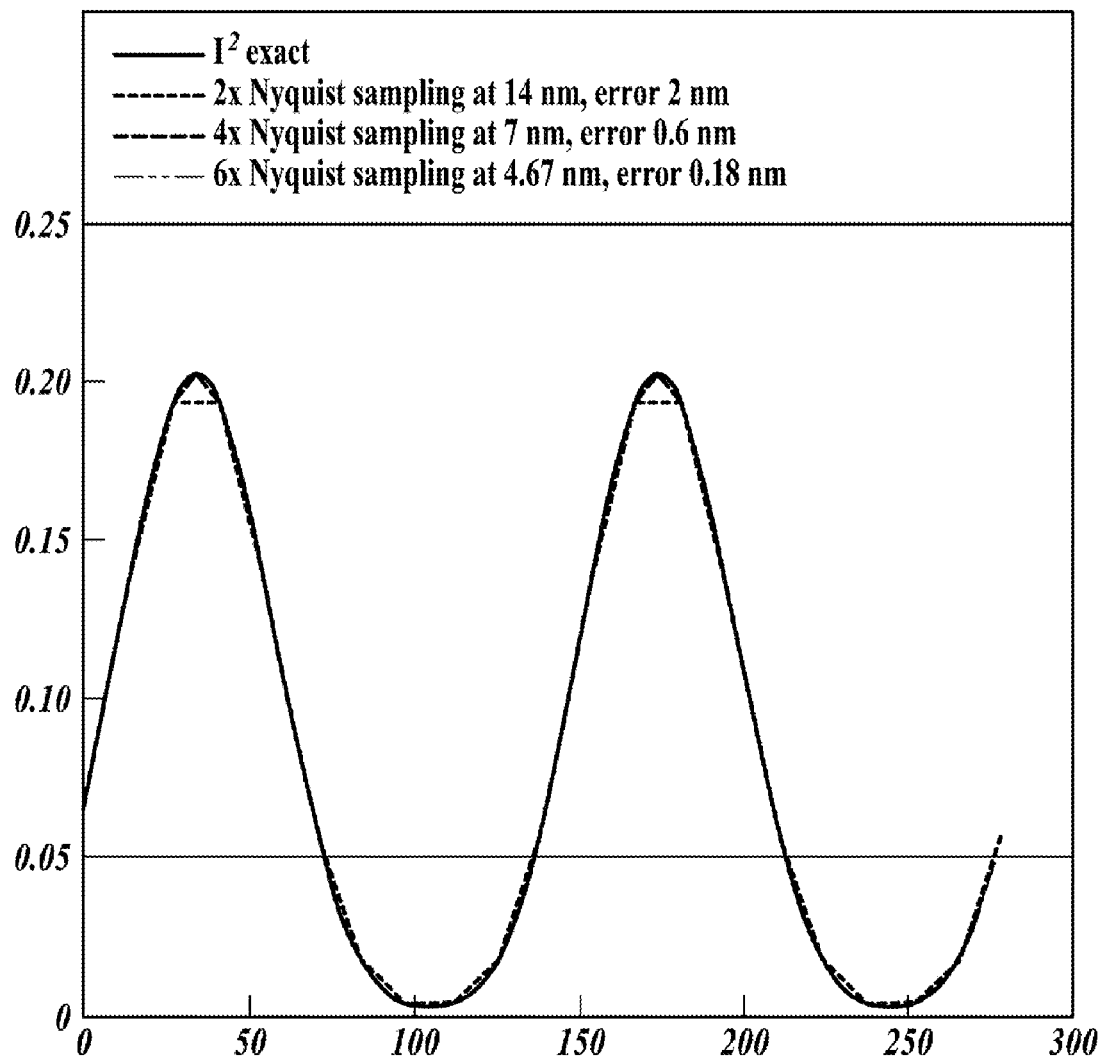
FIG. 18 illustrates image intensity versus squaring of an upsample.

A similar numerical experiment is done for the second derivatives, see FIG. 17 and the Table below.

TABLE

Second derivatives error.

| Pixel | Nyquist rate | Method | CD error |
| --- | --- | --- | --- |
| 28 nm | 1x | | |
| 14 nm | 2x | FFT | 0.82 nm |
| 7 nm | 4x | FFT | 0.24 nm |
| 7 nm | 4x | Finite differences | 1.6 nm |

Even at 4× upsampling the CD error is larger than 0.1 nm (0.28 nm and 0.24 nm), however the FFT is a more accurate method for both, the first and second derivatives.

Squaring

The following compares
  a) squaring at Nyquist, then upsampling, and thresholding to
  b) upsampling, squaring, and thresholding to answer the question if information can be kept at the Nyquist grid during squaring operation.

TABLE

Squaring calculation errors for CD = 70 nm.

| Pixel | Nyquist rate | Method | CD error |
| --- | --- | --- | --- |
| 28 nm | 1x | | |
| 14 nm | 2x | upsampling, squaring | 2 nm |
| 7 nm | 4x | upsampling squaring | 0.6 nm |
| 4.67 nm | 6x | upsampling, squaring | 0.18 nm |
| 3.5 nm | 8x | upsampling, squaring | 0.05 nm |
| 7 nm | 4x | squaring, upsampling | 0.6 nm |

For this particular example, squaring and upsampling can be interchanged, because the signal is sinusoidal. Therefore, it appears that squaring can be conducted on the Nyquist grid.

Square Root

It is possible to save some time by doing sqrt on Nyquist grid, then upsample versus the other way around (for $\log_2 N=10$):

4× upsample, sqrt:

$$F_{us}=5N^2\log_2 N+5(4N)^2\log_2(4N)+20(4N)^2\approx 1270N^2 \quad (96)$$

sqrt, 4× upsample:

$$F_{us}20N^2+5N^2\log_2 N+5(4N)^2\log_2(4N)\approx 970N^2 \quad (97)$$

Figure 19:
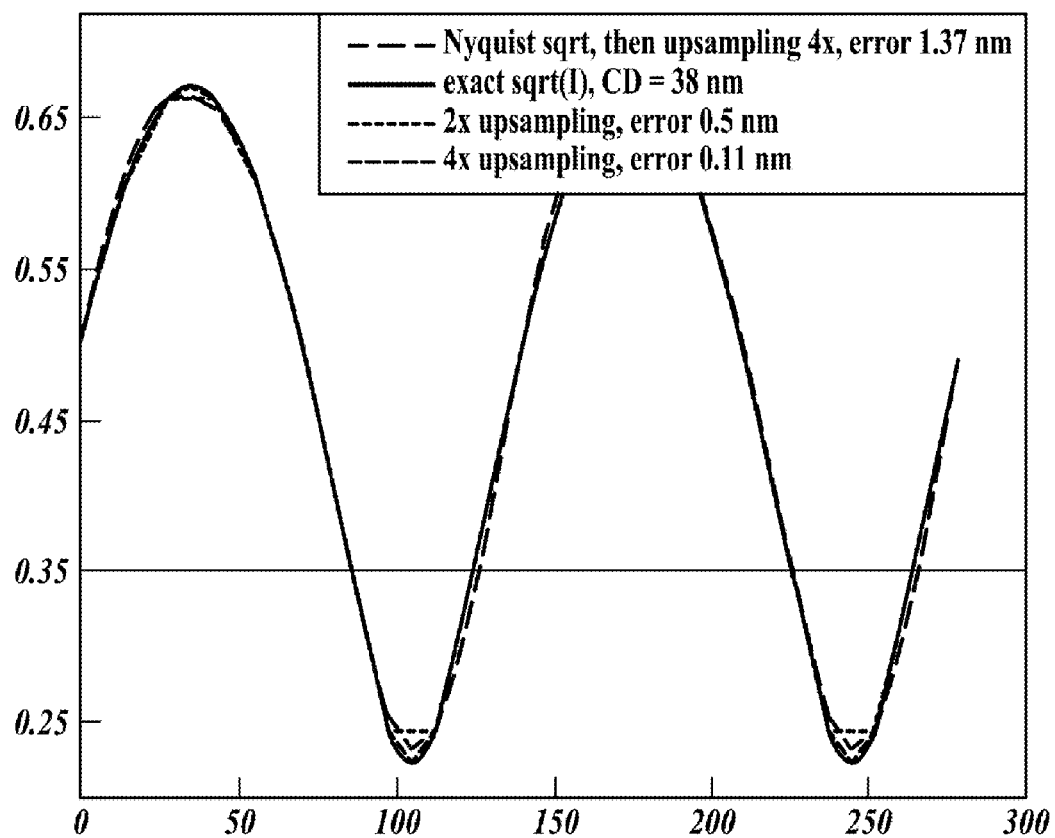
FIG. 19 illustrates image intensity versus the square root of an upsample.

The error is too high though for the second case, 1.37 nm, see FIG. 19.

TABLE

Square root error, exact CD = 38 nm at threshold 0.35.

| Pixel | Nyquist rate | Method | CD error |
|---|---|---|---|
| 28 nm | 1x | | |
| 14 nm | 2x | upsampling, sqrt | 0.5 nm |
| 7 nm | 4x | upsampling, sqrt | 0.11 nm |
| 7 nm | 4x | sqrt, upsampling | 1.37 nm |

The conclusion is that 4× upsampling is adequate for taking square root.

Choosing Grids

In one embodiment of the invention, the upsampling 4× is delayed as long as possible during the calculations of each modeling term. The grid must be upsampled and kept upsampled if any of the following conditions are encountered:

neutralization b>0 derivatives k>0 squaring (in anticipation of sqrt) n>1

While illustrative embodiments have been illustrated and described, it will be appreciated that various changes can be made therein without departing from the spirit of the invention as defined by the following claims and equivalents thereof.

The invention claimed is:

1. A method of simulating how a target mask pattern will be printed on a wafer that is coated with a resist material, comprising:
  receiving a number of image intensity values that are calculated on a grid of sample points on a wafer when the wafer is exposed with the mask pattern;
  supplying the image intensity values to a resist simulator that determines a resist surface function;
  selecting a single threshold contour value for the resist surface function; and
  defining the boundaries of how the mask pattern will be printed on the wafer from the contours of the resist surface function at the selected threshold.

2. The method of claim 1, wherein the resist simulator calculates the resist surface function by:
  summing the products of a number of coefficients and modeling terms, wherein each modeling term is defined by $$((\nabla^k I_{\pm b})^n \widehat{\otimes} G_{s,p})^{1/n}$$

where $\nabla k$ is a normalized $k^{th}$ derivative; $I_{+b}$ is I–b if I≧b or 0 if I <b; $I_{-b}$ is b–I if I≦b or 0 if I>b; where I is the image intensity in the wafer plane, b is a constant determined by model calibration and $G_{s,p}$ is a Gaussian kernel multiplied by a Laguerre polynomial, where s is a diffusion length of the kernel and p and n are integers.

3. A computer-readable media including a set of instructions that when executed cause a computer system to perform a method of simulating how a mask pattern will be printed on a wafer that is coated with a resist material, by:
  receiving a number of image intensity values that are calculated on a grid of sample points on a wafer when the wafer is exposed with the mask pattern;
  supplying the image intensity values to a resist simulator that determines a resist surface function;
  selecting a single threshold contour value from the resist surface function; and
  defining the boundaries of how the mask pattern will be printed on the wafer from the contours of the resist surface function at the selected threshold.

4. A method of determining a number of coefficients for use in a resist simulator that calculates the image intensity required to develop a resist material at a grid of points on a wafer, comprising:
  obtaining a number of measurements of features where a resist is exposed on a test wafer;

$$\text{minimizing the function} \left(\sum_i c_i M_i(x, y)\right) - T$$

where $M_i(x,y)$ is a function calculated at each of the measurement points, $c_i$ are coefficients, and T is a threshold value.

5. The method of claim 4 further comprising requiring the function $c_i M_i(x,y)$ to have a non-zero derivative at each of the measurement points.

6. A computer-readable media including a set of instructions that when executed cause a computer system to perform a method of determining a number of coefficients for use in a resist simulator that calculates the image intensity required to develop a resist material at a grid of points on a wafer, comprising:
  obtaining a number of measurements of features where a resist is exposed on a test wafer;

$$\text{minimizing the function} \left(\sum_i c_i M_i(x, y)\right) - T$$

where $M_i(x,y)$ is a resist simulator function calculated at each of the measurement points, $c_1$ are coefficients, and T is a threshold value.

\* \* \* \* \*